United States Patent
Parker et al.

(10) Patent No.: US 9,230,726 B1
(45) Date of Patent: Jan. 5, 2016

(54) TRANSFORMER-BASED POWER CONVERTERS WITH 3D PRINTED MICROCHANNEL HEAT SINK

(71) Applicant: Crane Electronics, Inc., Redmond, WA (US)

(72) Inventors: Ernest Parker, Mill Creek, WA (US); Fan Wang, Bothell, WA (US); James William White, Bothell, WA (US); Michael Robert Pierce, Bothell, WA (US); Randall Stephenson, Kirkland, WA (US); David L. Wiley, Arlington, WA (US)

(73) Assignee: Crane Electronics, Inc., Redmond, WA (US)

( * ) Notice: Subject to any disclaimer, the term of this patent is extended or adjusted under 35 U.S.C. 154(b) by 0 days.

(21) Appl. No.: 14/627,556

(22) Filed: Feb. 20, 2015

(51) Int. Cl.
*H05K 7/20* (2006.01)
*H01F 27/10* (2006.01)
(Continued)

(52) U.S. Cl.
CPC ............. *H01F 27/10* (2013.01); *B33Y 10/00* (2014.12); *B33Y 50/00* (2014.12); *B33Y 80/00* (2014.12); *H01F 41/00* (2013.01); *H05K 7/20254* (2013.01)

(58) Field of Classification Search
CPC .............. H05K 7/20; G06F 1/20; H02K 9/00; H01F 27/08; H02B 1/00
USPC ............... 361/679.46–679.53, 690–697, 698, 361/699, 700–714, 715, 720–727; 165/80.2, 80.3, 80.4, 80.5, 104.33, 165/121–126, 185; 336/54–61, 69, 70, 185, 336/212; 310/52–65; 174/15.1, 16.3, 50.52, 174/520; 312/223.2, 223.3, 236
See application file for complete search history.

(56) References Cited

U.S. PATENT DOCUMENTS

| 2,378,884 A | 6/1945 | Seifert |
| 2,474,395 A | 6/1949 | Early et al. |

(Continued)

FOREIGN PATENT DOCUMENTS

| CN | 1237854 C | 1/2006 |
| CN | 101326705 A | 12/2008 |

(Continued)

OTHER PUBLICATIONS

"Application Guide: Theory of Operation," MicroPower Direct, URL= http://micropowerdirect.com/PDF%20Files/Application%20Notes/Power%20Supply%20Theory%20of%20Operation.pdf, download date Apr. 18, 2012, 6 pages.

(Continued)

*Primary Examiner* — Michail V Datskovskiy
(74) *Attorney, Agent, or Firm* — Seed IP Law Group PLLC

(57) ABSTRACT

Systems and methods that allow for weight and size reduction of electronics components, such as transformer rectifier units (TRUs) or autotransformer rectifier units (ATRUs), by providing a fluid cooling system is utilized to provide high heat dissipation for a transformer assembly of TRUs or ATRUs by providing a thermal interface at the windings of the transformer assembly, which are the hottest spots in such assemblies. The cooling system may include a fluid-cooled winding heat sink element or "finger," which may be a thermally conductive bar (e.g., aluminum, copper) having microchannels therein positioned between the core and windings of a transformer or between turns of the windings of a transformer. Fluid passes through the microchannels of the heat sink element to provide direct cooling to the heat generating windings of the transformers. The heat sink element may be produced by an additive manufacturing technology.

29 Claims, 17 Drawing Sheets

(51) Int. Cl.
  *B33Y 10/00* (2015.01)
  *B33Y 80/00* (2015.01)
  *B33Y 50/00* (2015.01)
  *H01F 41/00* (2006.01)

(56) References Cited

U.S. PATENT DOCUMENTS

| | | | |
|---|---|---|---|
| 2,497,516 A | 2/1950 | Phelps | |
| 2,571,418 A | 10/1951 | Castenschiold | |
| 3,144,627 A * | 8/1964 | Dunnabeck et al. | 336/55 |
| 3,201,728 A * | 8/1965 | McWhirter | 336/60 |
| 3,761,843 A | 9/1973 | Cappucci | |
| 3,949,327 A | 4/1976 | Chapell | |
| 3,955,161 A | 5/1976 | MacTurk | |
| 3,999,150 A | 12/1976 | Caragliano et al. | |
| 4,128,868 A | 12/1978 | Gamble | |
| 4,255,784 A | 3/1981 | Rosa | |
| 4,337,569 A * | 7/1982 | Pierce | 29/605 |
| 4,342,143 A | 8/1982 | Jennings | |
| 4,430,758 A | 2/1984 | Snyder | |
| 4,533,986 A | 8/1985 | Jones | |
| 4,618,812 A | 10/1986 | Kawakami | |
| 4,635,002 A | 1/1987 | Riebeek | |
| 4,646,039 A | 2/1987 | Saad | |
| 4,719,552 A | 1/1988 | Albach et al. | |
| 4,743,835 A | 5/1988 | Bossé et al. | |
| 4,777,458 A | 10/1988 | Pardini | |
| 4,800,345 A | 1/1989 | Podell et al. | |
| 4,813,126 A | 3/1989 | Williamson | |
| 4,814,735 A | 3/1989 | Williamson | |
| 4,833,437 A | 5/1989 | Williamson | |
| 4,837,535 A | 6/1989 | Konishi et al. | |
| 4,901,048 A | 2/1990 | Williamson | |
| 4,920,309 A | 4/1990 | Szepesi | |
| 4,956,626 A * | 9/1990 | Hoppe et al. | 336/60 |
| 4,980,662 A | 12/1990 | Simon et al. | |
| 4,992,919 A | 2/1991 | Lee et al. | |
| 5,032,803 A | 7/1991 | Koch | |
| 5,046,238 A | 9/1991 | Daigle et al. | |
| 5,053,921 A | 10/1991 | Nelson et al. | |
| 5,065,122 A | 11/1991 | Juskey et al. | |
| 5,073,814 A | 12/1991 | Cole, Jr. et al. | |
| 5,081,432 A | 1/1992 | Devlin et al. | |
| 5,087,585 A | 2/1992 | Hayashi | |
| 5,099,309 A | 3/1992 | Kryzaniwsky | |
| 5,148,357 A | 9/1992 | Paice | |
| 5,235,496 A | 8/1993 | Chomette et al. | |
| 5,274,912 A | 1/1994 | Olenick et al. | |
| 5,280,192 A | 1/1994 | Kryzaniwsky | |
| 5,287,619 A | 2/1994 | Smith et al. | |
| 5,293,619 A | 3/1994 | Dean | |
| 5,309,629 A | 5/1994 | Traskos et al. | |
| 5,329,695 A | 7/1994 | Traskos et al. | |
| 5,369,379 A | 11/1994 | Fujiki | |
| 5,382,931 A | 1/1995 | Piloto et al. | |
| 5,396,165 A | 3/1995 | Hwang et al. | |
| 5,406,234 A | 4/1995 | Willems | |
| 5,418,502 A | 5/1995 | Ma et al. | |
| 5,428,840 A | 6/1995 | Sadhir | |
| 5,430,640 A | 7/1995 | Lee | |
| 5,432,677 A | 7/1995 | Mowatt et al. | |
| 5,436,550 A | 7/1995 | Arakawa | |
| 5,440,805 A | 8/1995 | Daigle et al. | |
| 5,446,842 A | 8/1995 | Schaeffer et al. | |
| 5,467,064 A | 11/1995 | Gu | |
| 5,469,124 A * | 11/1995 | O'Donnell et al. | 336/61 |
| 5,481,225 A | 1/1996 | Lumsden et al. | |
| 5,495,394 A | 2/1996 | Kornfeld et al. | |
| 5,499,005 A | 3/1996 | Gu et al. | |
| 5,521,807 A | 5/1996 | Chen et al. | |
| 5,526,517 A | 6/1996 | Jones et al. | |
| 5,534,830 A | 7/1996 | Ralph | |
| 5,557,245 A | 9/1996 | Taketa et al. | |
| 5,576,669 A | 11/1996 | Ruelke | |
| 5,579,207 A | 11/1996 | Hayden et al. | |
| 5,598,327 A | 1/1997 | Somerville et al. | |
| 5,604,490 A | 2/1997 | Blakley, III et al. | |
| 5,612,660 A | 3/1997 | Takimoto | |
| 5,628,053 A | 5/1997 | Araki et al. | |
| 5,631,822 A | 5/1997 | Silberkleit et al. | |
| 5,633,615 A | 5/1997 | Quan | |
| 5,638,262 A | 6/1997 | Brown | |
| 5,649,105 A | 7/1997 | Aldred et al. | |
| 5,657,537 A | 8/1997 | Saia et al. | |
| 5,689,217 A | 11/1997 | Gu et al. | |
| 5,689,641 A | 11/1997 | Ludwig et al. | |
| 5,691,629 A | 11/1997 | Belnap | |
| 5,694,303 A | 12/1997 | Silberkleit et al. | |
| 5,694,544 A | 12/1997 | Tanigawa et al. | |
| 5,704,042 A | 12/1997 | Hester et al. | |
| 5,724,508 A | 3/1998 | Harple, Jr. et al. | |
| 5,739,734 A | 4/1998 | Chen et al. | |
| 5,745,017 A | 4/1998 | Ralph | |
| 5,757,074 A | 5/1998 | Matloubian et al. | |
| 5,761,419 A | 6/1998 | Schwartz et al. | |
| 5,774,347 A | 6/1998 | Nakanishi | |
| 5,781,727 A | 7/1998 | Carleton et al. | |
| 5,799,320 A | 8/1998 | Klug | |
| 5,815,683 A | 9/1998 | Vogler | |
| 5,818,308 A | 10/1998 | Tanaka et al. | |
| 5,819,038 A | 10/1998 | Carleton et al. | |
| 5,831,418 A | 11/1998 | Kitagawa | |
| 5,834,992 A | 11/1998 | Kato et al. | |
| 5,835,789 A | 11/1998 | Ueda et al. | |
| 5,841,328 A | 11/1998 | Hayashi | |
| 5,867,072 A | 2/1999 | Logothetis | |
| 5,870,547 A | 2/1999 | Pommier et al. | |
| 5,870,585 A | 2/1999 | Stapleton | |
| 5,870,588 A | 2/1999 | Rompaey et al. | |
| 5,886,597 A | 3/1999 | Riad | |
| 5,887,170 A | 3/1999 | Ansberry et al. | |
| 5,892,509 A | 4/1999 | Jakobs et al. | |
| 5,895,473 A | 4/1999 | Williard et al. | |
| 5,903,504 A | 5/1999 | Chevallier et al. | |
| 5,929,729 A | 7/1999 | Swarup | |
| 5,940,082 A | 8/1999 | Brinegar et al. | |
| 5,945,892 A | 8/1999 | Kato et al. | |
| 5,966,057 A | 10/1999 | Kintis et al. | |
| 5,966,310 A | 10/1999 | Maeda et al. | |
| 5,974,335 A | 10/1999 | Talisa et al. | |
| 6,002,306 A | 12/1999 | Arakawa | |
| 6,002,307 A | 12/1999 | Arakawa | |
| 6,002,318 A * | 12/1999 | Werner et al. | 336/61 |
| 6,040,739 A | 3/2000 | Wedeen et al. | |
| 6,043,705 A | 3/2000 | Jiang | |
| 6,099,677 A | 8/2000 | Logothetis et al. | |
| 6,137,373 A | 10/2000 | Mori | |
| 6,137,383 A | 10/2000 | De Lillo | |
| 6,141,232 A | 10/2000 | Weinmeier et al. | |
| 6,154,106 A | 11/2000 | De Lillo | |
| 6,157,180 A | 12/2000 | Kuo | |
| 6,157,282 A * | 12/2000 | Hopkinson | 336/57 |
| 6,167,363 A | 12/2000 | Stapleton | |
| 6,169,320 B1 | 1/2001 | Stacey | |
| 6,170,154 B1 | 1/2001 | Swarup | |
| 6,204,736 B1 | 3/2001 | Logothetis | |
| 6,208,220 B1 | 3/2001 | Logothetis | |
| 6,218,015 B1 | 4/2001 | Allen et al. | |
| 6,222,427 B1 | 4/2001 | Kato et al. | |
| 6,236,194 B1 | 5/2001 | Manabe et al. | |
| 6,236,290 B1 | 5/2001 | Abe et al. | |
| 6,295,513 B1 | 9/2001 | Thackston | |
| 6,316,733 B1 | 11/2001 | Centanni et al. | |
| 6,320,509 B1 | 11/2001 | Brady et al. | |
| 6,335,872 B1 | 1/2002 | Zhou et al. | |
| 6,343,026 B1 | 1/2002 | Perry | |
| 6,395,374 B1 | 5/2002 | McAndrew et al. | |
| 6,456,511 B1 | 9/2002 | Wong | |
| 6,469,478 B1 | 10/2002 | Curtin | |
| 6,472,852 B1 | 10/2002 | Lethellier | |
| 6,492,890 B1 | 12/2002 | Woznlczka | |
| 6,501,031 B1 | 12/2002 | Glovatsky et al. | |
| 6,545,534 B1 | 4/2003 | Mehr | |
| 6,617,948 B2 | 9/2003 | Kuroshima et al. | |

(56) References Cited

U.S. PATENT DOCUMENTS

| | | | |
|---|---|---|---|
| 6,633,005 B2 | 10/2003 | Ichitsubo et al. | |
| 6,643,151 B1 | 11/2003 | Nebrigic et al. | |
| 6,697,955 B1 | 2/2004 | Malik et al. | |
| 6,707,348 B2 | 3/2004 | Ammar | |
| 6,734,775 B2 | 5/2004 | Chung | |
| 6,765,455 B1 | 7/2004 | De Lillo et al. | |
| 6,774,743 B2 | 8/2004 | De Lillo et al. | |
| 6,781,498 B2 | 8/2004 | König | |
| 6,798,177 B1 | 9/2004 | Liu et al. | |
| 6,815,739 B2 | 11/2004 | Huff et al. | |
| 6,850,048 B2 | 2/2005 | Orr et al. | |
| 6,961,990 B2 | 11/2005 | Logothetis | |
| 6,970,063 B1 | 11/2005 | Fromm et al. | |
| 6,998,901 B2 | 2/2006 | Lee | |
| 7,012,413 B1 | 3/2006 | Ye | |
| 7,042,307 B2 | 5/2006 | Logothetis | |
| 7,046,492 B2 | 5/2006 | Fromm et al. | |
| 7,061,212 B2 | 6/2006 | Phadke | |
| 7,095,215 B2 | 8/2006 | Liu et al. | |
| 7,127,808 B2 | 10/2006 | McAndrew et al. | |
| 7,129,808 B2* | 10/2006 | Roebke et al. | 336/55 |
| 7,164,584 B2 | 1/2007 | Walz | |
| 7,183,727 B2 | 2/2007 | Ferguson et al. | |
| 7,199,563 B2 | 4/2007 | Ikezawa | |
| 7,202,644 B2 | 4/2007 | Nitta et al. | |
| 7,206,210 B2 | 4/2007 | Harnett et al. | |
| 7,227,754 B2* | 6/2007 | Griesinger et al. | 361/714 |
| 7,242,168 B2 | 7/2007 | Müller et al. | |
| 7,250,827 B2 | 7/2007 | Logothetis | |
| 7,286,376 B2 | 10/2007 | Yang | |
| 7,297,875 B2 | 11/2007 | Lauriello | |
| 7,304,828 B1 | 12/2007 | Shvartsman | |
| 7,318,270 B1 | 1/2008 | O'Loughlin | |
| 7,339,804 B2 | 3/2008 | Uchida | |
| 7,369,024 B2* | 5/2008 | Yargole et al. | 336/61 |
| 7,443,278 B2 | 10/2008 | Kawahata et al. | |
| 7,448,126 B2 | 11/2008 | Logothetis | |
| 7,515,005 B2 | 4/2009 | Dan | |
| 7,564,706 B1 | 7/2009 | Herbert | |
| 7,577,539 B2 | 8/2009 | Hubanks et al. | |
| 7,579,901 B2 | 8/2009 | Yamashita | |
| 7,602,273 B2 | 10/2009 | Yoshikawa | |
| 7,616,459 B2 | 11/2009 | Huynh et al. | |
| 7,730,981 B2 | 6/2010 | McCabe et al. | |
| 7,742,318 B2 | 6/2010 | Fu et al. | |
| 7,786,712 B2 | 8/2010 | Williams | |
| 7,847,519 B2 | 12/2010 | Ho | |
| 7,884,317 B2 | 2/2011 | Casper | |
| 7,893,804 B2* | 2/2011 | Kaveh Ahangar et al. | 336/60 |
| 7,981,703 B2 | 7/2011 | Fjelstad | |
| 8,008,125 B2 | 8/2011 | McConnelee et al. | |
| 8,009,004 B2* | 8/2011 | Ahangar et al. | 336/60 |
| 8,040,699 B2 | 10/2011 | Huynh et al. | |
| 8,067,992 B2 | 11/2011 | Chen et al. | |
| 8,072,195 B2 | 12/2011 | Aan De Stegge et al. | |
| 8,102,162 B2 | 1/2012 | Moussaoui et al. | |
| 8,279,631 B2 | 10/2012 | Yang | |
| 8,350,659 B2 | 1/2013 | Dziubek et al. | |
| 8,358,118 B2 | 1/2013 | Chen et al. | |
| 8,378,647 B2 | 2/2013 | Yonezawa et al. | |
| 8,508,195 B2 | 8/2013 | Uno | |
| 8,520,415 B1 | 8/2013 | Krishnamoorthy et al. | |
| 8,552,589 B2 | 10/2013 | Ghosh et al. | |
| 8,555,491 B2 | 10/2013 | Boureghda et al. | |
| 8,570,006 B2 | 10/2013 | Moussaoui et al. | |
| 8,630,097 B2 | 1/2014 | Kim et al. | |
| 8,649,128 B2 | 2/2014 | Wang et al. | |
| 8,736,240 B2 | 5/2014 | Liu et al. | |
| 8,764,247 B2* | 7/2014 | Pattekar et al. | 362/294 |
| 8,810,214 B2 | 8/2014 | Van Dijk et al. | |
| 9,030,178 B2 | 5/2015 | Chang et al. | |
| 9,106,142 B2 | 8/2015 | Huang et al. | |
| 2002/0011914 A1 | 1/2002 | Ikeura et al. | |
| 2002/0015320 A1 | 2/2002 | Mochikawa et al. | |
| 2002/0062339 A1 | 5/2002 | Carter et al. | |
| 2002/0071300 A1 | 6/2002 | Jang et al. | |
| 2002/0130752 A1 | 9/2002 | Kuroshima et al. | |
| 2004/0125523 A1 | 7/2004 | Edwards et al. | |
| 2004/0178776 A1 | 9/2004 | Hansen et al. | |
| 2005/0233122 A1 | 10/2005 | Nishimura et al. | |
| 2006/0039172 A1 | 2/2006 | Soldano | |
| 2006/0044103 A1* | 3/2006 | Roebke et al. | 336/208 |
| 2006/0132105 A1 | 6/2006 | Prasad et al. | |
| 2006/0132272 A1 | 6/2006 | Kitahara et al. | |
| 2006/0212138 A1 | 9/2006 | Zhang | |
| 2006/0220629 A1 | 10/2006 | Saito et al. | |
| 2007/0152644 A1 | 7/2007 | Vinn | |
| 2007/0183920 A1 | 8/2007 | Lu et al. | |
| 2008/0031014 A1 | 2/2008 | Young | |
| 2008/0150670 A1 | 6/2008 | Chung et al. | |
| 2008/0174396 A1 | 7/2008 | Choi et al. | |
| 2008/0186121 A1 | 8/2008 | Kawahata et al. | |
| 2008/0197724 A1* | 8/2008 | Cullen et al. | 310/53 |
| 2008/0303606 A1 | 12/2008 | Liu et al. | |
| 2009/0067206 A1 | 3/2009 | Oguchi et al. | |
| 2009/0128110 A1 | 5/2009 | DeLurio et al. | |
| 2009/0162557 A1 | 6/2009 | Lu et al. | |
| 2009/0167432 A1 | 7/2009 | van den Heuvel | |
| 2009/0174381 A1 | 7/2009 | Ojanen et al. | |
| 2009/0237057 A1 | 9/2009 | Dishman et al. | |
| 2009/0256547 A1 | 10/2009 | Akyildiz et al. | |
| 2009/0273431 A1 | 11/2009 | Hurst | |
| 2009/0302775 A1 | 12/2009 | Alexandrov | |
| 2009/0321045 A1* | 12/2009 | Hernon et al. | 165/80.2 |
| 2009/0321046 A1* | 12/2009 | Hernon et al. | 165/80.3 |
| 2010/0014330 A1 | 1/2010 | Chang et al. | |
| 2010/0117715 A1 | 5/2010 | Ariyama | |
| 2010/0176755 A1 | 7/2010 | Hoadley et al. | |
| 2010/0253309 A1 | 10/2010 | Xi et al. | |
| 2011/0090038 A1 | 4/2011 | Perchlik | |
| 2011/0169471 A1 | 7/2011 | Nagasawa | |
| 2011/0241637 A1 | 10/2011 | Parker | |
| 2012/0048605 A1 | 3/2012 | Chung | |
| 2012/0114927 A1 | 5/2012 | Khaselev et al. | |
| 2012/0153493 A1 | 6/2012 | Lee et al. | |
| 2012/0268227 A1* | 10/2012 | Howes et al. | 336/57 |
| 2013/0010399 A1 | 1/2013 | Dziubek et al. | |
| 2013/0020867 A1 | 1/2013 | Hughes et al. | |
| 2013/0021008 A1 | 1/2013 | Hume et al. | |
| 2013/0021009 A1 | 1/2013 | Waltman et al. | |
| 2013/0021108 A1 | 1/2013 | Hughes | |
| 2013/0021702 A1 | 1/2013 | Waltman et al. | |
| 2013/0049918 A1 | 2/2013 | Fu et al. | |
| 2013/0201631 A1 | 8/2013 | Parker et al. | |
| 2013/0245854 A1 | 9/2013 | Rinne et al. | |
| 2013/0272040 A1 | 10/2013 | Feng et al. | |
| 2013/0299148 A1* | 11/2013 | Hernon et al. | 165/168 |
| 2014/0016356 A1 | 1/2014 | Furmanczyk et al. | |
| 2014/0070887 A1 | 3/2014 | Lam et al. | |
| 2014/0118946 A1* | 5/2014 | Tong et al. | 361/704 |
| 2014/0159250 A1 | 6/2014 | Nickerson | |
| 2014/0327417 A1 | 11/2014 | Zhu et al. | |
| 2015/0137412 A1* | 5/2015 | Schalansky | 264/129 |

FOREIGN PATENT DOCUMENTS

| | | |
|---|---|---|
| CN | 201219235 Y | 4/2009 |
| CN | 103582997 A | 2/2014 |
| CN | 104145538 A | 11/2014 |
| CN | 104704742 A | 6/2015 |
| EP | 0 520 434 A1 | 6/1992 |
| EP | 0 606 973 A1 | 1/1994 |
| EP | 0 767 496 A1 | 4/1997 |
| EP | 0 795 907 A1 | 9/1997 |
| EP | 1 060 647 B1 | 1/2007 |
| EP | 1 933 340 A1 | 6/2008 |
| EP | 1 869 724 B1 | 5/2011 |
| EP | 2 813 132 A1 | 12/2014 |
| GB | 1071469 A | 6/1967 |
| GB | 1114013 A | 5/1968 |
| GB | 2 325 996 A | 12/1998 |
| IN | 201407180 P1 | 4/2015 |
| JP | 59-86307 A | 5/1984 |
| JP | 63-220603 A | 9/1988 |

(56) References Cited

FOREIGN PATENT DOCUMENTS

| | | | |
|---|---|---|---|
| JP | 5-144973 A | 6/1993 | |
| JP | 8-78252 A | 3/1996 | |
| JP | 2567069 B2 | 10/1996 | |
| JP | 10-270630 A | 10/1998 | |
| JP | 2001-024333 A | 1/2001 | |
| JP | 2001-320250 A | 11/2001 | |
| JP | 2002-076799 A | 3/2002 | |
| JP | 2003-173913 A | 6/2003 | |
| JP | 2007-251076 A | 9/2007 | |
| JP | 2007-263944 A | 10/2007 | |
| JP | 2009-141197 A | 6/2009 | |
| JP | 5030216 B2 | 9/2012 | |
| KR | 2008-019196 A | 3/2008 | |
| KR | 2008-101784 A | 11/2008 | |
| WO | 99/41957 A1 | 8/1999 | |
| WO | 01/22444 A1 | 3/2001 | |
| WO | 2005/027197 A2 | 3/2005 | |
| WO | 2005/079353 A2 | 9/2005 | |
| WO | 2006/099419 A1 | 9/2006 | |
| WO | 2009/094537 A2 | 7/2009 | |
| WO | 2011/123680 A2 | 10/2011 | |
| WO | 2012/116263 A1 | 8/2012 | |
| WO | WO2012/100810 A1 * | 8/2012 | ............ F28F 21/04 |
| WO | 2013/119643 A1 | 8/2013 | |
| WO | 2014/039982 A1 | 3/2014 | |
| WO | WO2014/103298 A1 * | 7/2014 | ............ H01F 27/16 |

OTHER PUBLICATIONS

"Buck converter," URL= http://en.wikipedia.org/wiki/Buck_converter, download date Jun. 23, 2011, 14 pages.

"EMI Suppression Filters (EMIFIL®) for AC Power Lines," Murata Manufacturing Co., Ltd., Cat. No. C09E-14, downloaded on Feb. 21, 2014, 27 pages.

"Maximum Flexible Power (MFP) Single Output Point of Load: Technical Preview—3—6 VDC IN, 7 AMP, Non-Isolated DC/DC Converter," Crane Aerospace & Electronics Power Solutions, 2010, 17 pages.

"Step-gap "E" core swing chokes: Improved regulation and higher efficiency are possible when operating at minimum current levels," Technical Bulletin: Bulletin FC-S4, Magnetics Division, Spang & Company, Butler, Pennsylvania, 2001, 4 pages.

"Synchronous Rectification Aids Low-Voltage Power Supplies," Maxim Integrated Products, URL= http://www.maxim-ic.com/appnotes/index.mvp/id/652, download date Jun. 22, 2011, 6 pages.

Barrett, "Microwave Printed Circuits—The Early Years," *IEEE Transactions on Microwave Theory and Techniques MTT-32*(9):983-990, Sep. 1984.

Bharj, "Evanescent Mode Waveguide to Microstrip Transition," *Microwave Journal—International Edition 26*, vol. 2, p. 147, Feb. 1983.

Chiou et al., "Balun design for uniplanar broad band double balanced mixer," *Electronics Letters 31*(24):2113-2114, Nov. 23, 1995.

Coates, "Power supplies—3.0 Switched Mode Power Supplies," www.learnabout-electronics.org, 2007-2013, 20 pages.

Cohn, "Shielded Coupled-Strip Transmission Line," *IRE Transactions on Microwave Theory and Techniques MTT-3*(5):29-38, Oct. 1955.

Craven et al., "The Design of Evanescent Mode Waveguide Bandpass Filters for a Prescribed Insertion Loss Characteristic," *IEEE Transactions on Microwave Theory and Techniques MTT-19*(3):295-308, Mar. 1971.

Cristal et al., "Theory and Tables of Optimum Symmetrical TEM-Mode Coupled-Transmission-Line Directional Couplers," *IEEE Transactions on Microwave Theory and Techniques MTT-13*(5):544-558, Sep. 1965.

De Lillo, "Multilayer Dielectric Evanescent Mode Waveguide Filter," U.S. Appl. No. 09/677,674, filed Oct. 2, 2000, 48 pages.

De Lillo, "Multilayer Dielectric Evanescent Mode Waveguide Filter Utilizing Via Holes," U.S. Appl. No. 09/604,502, filed Jun. 27, 2000, 57 pages.

Dziubek et al., "Transformer With Concentric Windings and Method of Manufacture of Same," Preliminary Amendment filed Sep. 29, 2010, for U.S. Appl. No. 12/580,551, 3 pages.

Dziubek et al., "Transformer With Concentric Windings and Method of Manufacture of Same," Amendment filed Feb. 9, 2012, for U.S. Appl. No. 12/580,551, 13 pages.

Dziubek et al., "Transformer With Concentric Windings and Method of Manufacture of Same," Office Action mailed Jun. 20, 2012, for U.S. Appl. No. 12/580,551, 12 pages.

Dziubek et al., "Transformer With Concentric Windings and Method of Manufacture of Same," Notice of Allowance mailed Sep. 10, 2012, for U.S. Appl. No. 12/580,551, 17 pages.

Dziubek et al., "Transformer With Concentric Windings and Method of Manufacture of Same," Office Action mailed May 13, 2013, for U.S. Appl. No. 13/607,367, 11 pages.

Dziubek et al., "Transformer With Concentric Windings and Method of Manufacture of Same," Amendment filed Sep. 11, 2013, for U.S. Appl. No. 13/607,367, 16 pages.

Dziubek et al., "Transformer With Concentric Windings and Method of Manufacture of Same," Office Action mailed Jan. 6, 2014, for U.S. Appl. No. 13/607,367, 14 pages.

Dziubek et al., "Transformer With Concentric Windings and Method of Manufacture of Same," Amendment filed Apr. 9, 2014, for U.S. Appl. No. 13/607,367, 15 pages.

Dziubek et al., "Transformer With Concentric Windings and Method of Manufacture of Same," Office Action mailed Jul. 29, 2014, for U.S. Appl. No. 13/607,367, 16 pages.

Dziubek et al., "Transformer With Concentric Windings and Method of Manufacture of Same," Office Action for U.S. Appl. No. 12/580,551, mailed Jun. 20, 2012, 13 pages.

eCircuit Center, "Op Amp Input Offset Voltage," 2002, retrieved from http://www.ecircuitcenter.com/Circuits/op_voff/op_voff.htm on Mar. 26, 2012, 3 pages.

eCircuit Center, "Op Amp Offset Adjustment," 2002, retrieved from http://www.ecircuitcenter.com/Circuits/op_voff/op_voff2.htm on Mar. 26, 2012, 3 pages.

European Search Report, dated May 21, 2003, for EP application No. 00939819.9, 2 pages.

Göbl, C.; Faltenbacher, J., "Low Temperature Sinter Technology Die Attachment for Power Electronic Applications," CIPS Seminar, Nuremberg, Germany, Mar. 16-19, 2010, 5 pgs.

Gokdemir et al., "Design and Performance of GaAs MMIC CPW Baluns Using Overlaid and Spiral Couplers," *1997 IEEE MTT-S Digest*, pp. 401-404, 1997.

Gunston, *Microwave Transmission-Line Impedance Data*, Van Nostrand Reinhold Company, London, 1972, pp. 23-24, 26, 61. (6 total pages).

Gunston, *Microwave Transmission-Line Impedance Data*, Van Nostrand Reinhold Company, London, 1972, pp. 63-81.

Hallford, "A Designer's Guide to Planar Mixer Baluns," *Microwaves*, 52-57, Dec. 1979, 4 pages.

Henderson, "Mixers: Part 2—Theory and Technology," *RF Microwave Designer's Handbook*, pp. 476-483, 1998.

Ho et al., "New analysis technique builds better baluns," *Microwaves & RF*, pp. 99-102, Aug. 1985.

Howe, Jr., "Microwave Integrated Circuits—An Historical Perspective," *IEEE Transactions on Microwave Theory and Techniques MTT-32*(9):991-996, Sep. 1984.

Hughes et al., "Self Synchronizing Power Converter Apparatus and Method Suitable for Auxiliary Bias for Dynamic Load Applications," Notice of Allowance mailed May 14, 2014, for U.S. Appl. No. 13/185,217, 10 pages.

Hughes, "Oscillator Apparatus and Method With Wide Adjustable Frequency Range," Office Action mailed Jun. 5, 2013, for U.S. Appl. No. 13/185,152, 17 pages.

Hughes, "Oscillator Apparatus and Method With Wide Adjustable Frequency Range," Amendment filed Oct. 7, 2013, for U.S. Appl. No. 13/185,152, 15 pages.

Hughes, "Oscillator Apparatus and Method With Wide Adjustable Frequency Range," Office Action mailed Jan. 28, 2014, for U.S. Appl. No. 13/185,152, 15 pages.

(56) References Cited

OTHER PUBLICATIONS

Hughes, "Oscillator Apparatus and Method With Wide Adjustable Frequency Range," Amendment filed Apr. 24, 2014, 2014, for U.S. Appl. No. 13/185,152, 8 pages.
Hughes, "Oscillator Apparatus and Method With Wide Adjustable Frequency Range," Notice of Allowance mailed Jul. 14, 2014, for U.S. Appl. No. 13/185,152, 12 pages.
Hume et al., "Power Converter Apparatus and Method With Compensation for Light Load Conditions," Office Action mailed Nov. 6, 2013, for U.S. Appl. No. 13/185,142, 11 pages.
International Search Report, dated Aug. 12, 2002, for PCT/US01/50033, 1 page.
International Search Report, mailed Dec. 20, 2013, for PCT/US2013/058784, 3 pages.
International Search Report, mailed Jun. 2, 2013, for PCT/US2013/024907, 4 pages.
International Search Report, mailed Jun. 8, 2011, for PCT/US2010/052705, 5 pages.
International Search Report, mailed Jun. 8, 2011, for PCT/US2010/052707, 5 pages.
International Search Report, mailed Oct. 14, 2011, for PCT/US2011/030778, 3 pages.
Jansen et al., "Improved compaction of multilayer MMIC/MCM baluns using lumped element compensation," *1997 IEEE MTT-S Digest*, pp. 277-280, 1997.
Konishi, "Novel Dielectric Waveguide Components—Microwave Applications of New Ceramic Materials," *Proceedings of the IEEE* 79(6):726-740, Jun. 1991.
Kristjansson et al., "Solutions to Today's Low Voltage Power Design Challenges Using High-Efficiency, Non-Isolated Point of Load Converters: A Discussion of the Interpoint™ MFP Series™ Point of Load Converter," Crane Aerospace & Electronics, Power Solutions—Interpoint Products, Redmond, WA, Oct. 2011, Revised Jan. 2012, 25 pages.
Kumar et al., "An Improved Planar Balun Design for Wireless Microwave and RF Applications," *1997 IEEE*, pp. 257-260, Apr. 1997.
Lam et al., "Dynamic Maneuvering Configuration for Multiple Control Modes in a Unified Servo System," Office Action mailed Dec. 23, 2014, for U.S. Appl. No. 14/333,705, 6 pages.
Lam et al., "Impedance Compensation for Operational Amplifiers Used in Variable Environments," Notice of Allowance mailed Jun. 27, 2014, for U.S. Appl. No. 13/609,107, 9 pages.
Lam et al., "Dynamic Maneuvering Configuration for Multiple Control Modes in a Unified Servo System," U.S. Appl. No. 14/333,705, filed Jul. 17, 2014, 36 pages.
Lam et al., "Dynamic Maneuvering Configuration of Multiple Control Modes in a Unified Servo System," Amendment filed Mar. 6, 2015, for U.S. Appl. No. 14/333,705, 11 pages.
Lam et al., "Impedance Compensation for Operational Amplifiers Used in Variable Environments," Office Action mailed Feb. 7, 2014, for U.S. Appl. No. 13/609,107, 11 pages.
Lam et al., "Impedance Compensation for Operational Amplifiers Used in Variable Environments," Amendment filed May 6, 2014, for U.S. Appl. No. 13/609,107, 12 pages.
Lauriello, "Process for Manufacturing Fusion Bonded Assembly With Attached Leads," U.S. Appl. No. 11/901,749, filed Sep. 19, 2007, 14 pages.
Ledain et al., "Innovative Multilayer Technologies for Active Phased Array Antennas," Dassault Electronique, Saint-Cloud, France, 1997, 7 pages.
Levy, "General Synthesis of Asymmetric Multi-Element Coupled-Transmission-Line Directional Couplers," *IEEE Transactions on Microwave Theory and Techniques MTT-11*(4):226-237, Jul. 1963.
Levy, "Tables for Asymmetric Multi-Element Coupled-Transmission-Line Directional Couplers," *IEEE Transactions on Microwave Theory and Techniques MTT-12*(3):275-279, May 1964.
Light et al., "High Frequency, Fluoropolymer-Based Packaging Technology," IBM Microelectronics, Endicott, NY, Oct. 1994, 16 pages.

Maas, "The Diode-Ring Mixer," *RF Design Magazine*, pp. 54-62, Nov. 1993, 5 pages.
Manfredi et al., "Additive Manufacturing of Al Alloys and Aluminium Matrix Composites (AMCs)," in Monteiro (ed.), *Light Metal Alloys Applications*, InTech, Jun. 11, 2014, 32 pages.
Marchand, "Transmission-Line Conversion," *Electronics* 17(12):142-145, Dec. 1944.
Merriam-Webster, "Directly," retrieved from http://www.merriam-webster.com/dictionary/directly, on Nov. 6, 2012, 1 page.
Mitsuya, "Basics of Noise Countermeasures—Lesson 14: Using Common Mode Choke Coils for Power Supply Lines," Murata Manufacturing Co., Ltd., Oct. 28, 2014, retrieved on Feb. 4, 2015, from http://www.murata.com/en-eu/products/emiconfun/emc/2014/10/28/en-20141028-pl, 3 pages.
Ng, "Implementing Constant Current Constant Voltage AC Adapter by NCP1200 and NCP4300A," ON Semiconductor, Application Note, Publication Order Number: AND8042/D, Feb. 2001, 12 pages.
Nguyen et al., "Nulling Input Offset Voltage of Operational Amplifiers," Mixed Signal Products, Texas Instruments—Application Report SLOA045, Aug. 2000, pp. 1-15.
Oltman, "The Compensated Balun," *IEEE Transactions on Microwave Theory and Techniques MTT-14*(3):112-119, Mar. 1966.
Palamutcuoglu et al., "Broadband Microwave Mixer Mounted on Suspended Line Baluns," *1994 IEEE*, pp. 500-503, 1994.
Parker et al., "Integrated Tri-State Electromagnetic Interference Filter and Line Conditioning Module," U.S. Appl. No. 14/632,818, filed Feb. 26, 2015, 31 pages.
Parker, "Switched Capacitor Hold-Up Scheme for Constant Boost Output Voltage," Amendment filed Feb. 15, 2013, for U.S. Appl. No. 12/751,067, 15 pages.
Parker, "Switched Capacitor Hold-Up Scheme for Constant Boost Output Voltage," Office Action mailed Mar. 28, 2012, for U.S. Appl. No. 12/751,067, 16 pages.
Parker, "Switched Capacitor Hold-Up Scheme for Constant Boost Output Voltage," Amendment filed Jul. 30, 2012, for U.S. Appl. No. 12/751,067, 18 pages.
Parker, "Switched Capacitor Hold-Up Scheme for Constant Boost Output Voltage," Office Action mailed Nov. 16, 2012, for U.S. Appl. No. 12/751,067, 20 pages.
Parker, "Switched Capacitor Hold-Up Scheme for Constant Boost Output Voltage," Amendment filed Jan. 16, 2013, for U.S. Appl. No. 12/751,067, 15 pages.
Parker, "Switched Capacitor Hold-Up Scheme for Constant Boost Output Voltage," Office Action mailed Jul. 30, 2013, for U.S. Appl. No. 12/751,067, 18 pages.
Parker, "Switched Capacitor Hold-Up Scheme for Constant Boost Output Voltage," Amendment filed Oct. 30, 2013, for U.S. Appl. No. 12/751,067, 19 pages.
Parker, "Switched Capacitor Hold-Up Scheme for Constant Boost Output Voltage," Notice of Allowance mailed Feb. 3, 2014, for U.S. Appl. No. 12/751,067, 11 pages.
Pascu, "Error Amplifier with Forced Equilibrium Adaptor," Kepco, Inc., retrieved from http://www.kepcopower.com/equibm2.htm#fig2, dated May 22, 2014, 8 pages.
Perchlik, "Transformer Having Interleaved Windings and Method of Manufacture of Same," U.S. Appl. No. 12/580,548, filed Oct. 16, 2009, 25 pages.
Perchlik, "Transformer Having Interleaved Windings and Method of Manufacture of Same," Preliminary Amendment filed Sep. 29, 2010, for U.S. Appl. No. 12/580,548, 3 pages.
Perchlik, "Transformer Having Interleaved Windings and Method of Manufacture of Same," Office Action mailed Dec. 21, 2011, for U.S. Appl. No. 12/580,548, 12 pages.
Perchlik, "Transformer Having Interleaved Windings and Method of Manufacture of Same," Amendment filed Mar. 8, 2012, for U.S. Appl. No. 12/580,548, 16 pages.
Perchlik, "Transformer Having Interleaved Windings and Method of Manufacture of Same," Office Action mailed Jul. 18, 2012, for U.S. Appl. No. 12/580,548, 9 pages.
Perchlik, "Transformer Having Interleaved Windings and Method of Manufacture of Same," Amendment filed Sep. 18, 2012, for U.S. Appl. No. 12/580,548, 14 pages.

(56) References Cited

OTHER PUBLICATIONS

Perchlik, "Transformer Having Interleaved Windings and Method of Manufacture of Same," Office Action mailed Oct. 16, 2012, for U.S. Appl. No. 12/580,548, 11 pages.

Rizzi, *Microwave Engineering: Passive Circuits*, Prentice Hall, Englewood Cliffs, New Jersey, pp. 200-219, 1988, 21 pages.

Sang Won Yoon; Shiozaki, K.; Yasuda, S.; Glover, M.D., "Highly reliable nickel-tin transient liquid phase bonding technology for high temperature operational power electronics in electrified vehicles," *Applied Power Electronics Conference and Exposition (APEC), 2012 Twenty-Seventh Annual IEEE*, Feb. 5-9, 2012, pp. 478-482.

Shrisavar, "Introduction to Power Management," Texas Instruments, Biracha Digital Power Ltd., 2014, 37 pages.

Snyder, "New Application of Evanescent Mode Waveguide to Filter Design," *IEEE Transactions on Microwave Theory and Techniques MTT-25*(12):1013-1021, Dec. 1977.

Sturdivant, "Balun Designs for Wireless, . . . Mixers, Amplifiers and Antennas," *Applied Microwave*, pp. 34-44, Summer 1993, 6 pages.

Toyoda et al., "Three-Dimensional MMIC and Its Application: An Ultra-Wideband Miniature Balun,"*IEICE Trans. Electron. E78-C*(8):919-924, Aug. 1995.

Tresselt, "Design and Computed Theoretical Performance of Three Classes of Equal-Ripple Nonuniform Line Couplers," *IEEE Transactions on Microwave Theory and Techniques MTT-17*(4):218-230, Apr. 1969.

Tutt et al., "A Low Loss, 5.5 GHz—20 GHz Monolithic Balun," *1997 IEEE MTT-S Digest*, pp. 933-936, 1997.

Waltman et al., "Input Control Apparatus and Method With Inrush Current, Under and Over Voltage Handling," Office Action mailed Jun. 17, 2014, for U.S. Appl. No. 13/185,210, 8 pages.

Waltman et al., "Power Converter Apparatus and Method With Compensation for Current Limit/Current Share Operation," Office Action mailed Dec. 17, 2013, for U.S. Appl. No. 13/185,172, 15 pages.

Waltman et al., "Power Converter Apparatus and Method With Compensation for Current Limit/Current Share Operation," Amendment filed Mar. 17, 2014, for U.S. Appl. No. 13/185,172, 16 pages.

Waltman et al., "Power Converter Apparatus and Method With Compensation for Current Limit/Current Share Operation," Notice of Allowance mailed May 8, 2014, for U.S. Appl. No. 13/185,172, 10 pages.

Waltman et al., "Power Converter Apparatus and Methods," U.S. Appl. No. 61/508,937, filed Jul. 18, 2011, 139 pages.

Willems et al., "Evanescent-Mode Waveguide Filters Built in a Day," *Microwaves & RF 26*(7):117-124, Jul. 1987, 5 pages.

Written Opinion, mailed Dec. 20, 2013, for PCT/US2013/058784, 4 pages.

Written Opinion, mailed Jun. 2, 2013, for PCT/US2013/024907, 10 pages.

Written Opinion, mailed Jun. 8, 2011, for PCT/US2010/052705, 4 pages.

Written Opinion, mailed Jun. 8, 2011, for PCT/US2010/052707, 3 pages.

Written Opinion, mailed Oct. 14, 2011, for PCT/US2011/030778, 5 pages.

Xing et al., "Power System Architecture with Back-Up Power for Servers," ERC Program of the National Science Foundation, 5 pages.

Chinese Office Action with English Translation dated May 22, 2015, for corresponding CN Application No. 201280016631.1, 15 pages.

Parker et al., "Integrated Tri-State Electromagnetic Interference Filter and Line Conditioning Module," Office Action mailed Apr. 24, 2015, for U.S. Appl. No. 14/632,818, 11 pages.

Dhakal et al., "Transient Liquid Phase (TLP) Bonding and sintered Silver Paste for Die-attached/Substrate-attach in High-power, High-temperature Applications," Idaho Microelectronics Labortory (IML), pp. 1-28, Oct. 21, 2011.

International Search Report, mailed Aug. 31, 2015 for PCT/US2015/033321, 9 pages.

Parker et al., "Multilayer Electronics Assembly and Method for Embedding Electrical Circuit Components Within a Three Dimensional Module," Office Action mailed Jul. 28, 2015, for U.S. Appl. No. 13/758,843, 23 pages.

\* cited by examiner

TRANSFORMER-BASED POWER CONVERTERS WITH 3D PRINTED MICROCHANNEL HEAT SINK

BACKGROUND

1. Technical Field

The present disclosure generally relates to systems, methods and articles for cooling components.

2. Description of the Related Art

Modern aircraft include generators that generate power during flight and provide the generated power to onboard aircraft electric power systems. The generators utilize rotation of the aircraft engine to generate AC power using various power generation techniques. Power generated in this manner may be 230V 400 Hz AC power, for example. While the aircraft is on ground, aircraft engines can be turned off, the onboard generator ceases generating power, and the onboard electric system instead may receive AC power from a ground cart. Power provided from the ground cart may be 115V 400 Hz AC power, for example.

While the power sources provide AC power, aircraft components often require DC power instead of AC power. AC-DC power conversion may be accomplished with a plurality of diode pairs, where each pair is connected to a different phase of the AC input, to provide a rectified DC output. However, this type of AC-DC conversion may lead to substantial current harmonics that pollute the electric power generation and distribution system. To reduce current harmonics, multi-phase autotransformers may be employed to increase the number of AC phases supplied to the rectifier unit. For example, in an 18-pulse passive AC-DC converter, the autotransformer is used to transform three-phase AC input, whose phases are spaced at 120°, into a system with nine phases spaced at 40°. This has the effect of reducing the harmonics associated with the AC-DC conversion.

A transformer typically includes windings of electrically conductive material such as wire. The windings are spaced sufficiently close together such that an electrical current flow through one winding will induce an electrical current to flow in another winding when connected to a load. Windings through which current is driven are typically denominated as primary windings, while windings in which current is induced are typically denominated as secondary windings. The transformer also may include a core, for example a magnetic or ferrous core around which the windings are wrapped.

A rectifier typically includes a plurality of diodes or thyristors configured to convert an AC signal to a DC signal. For example, a full-bridge rectifier may be employed to convert an AC signal to a DC signal. Additional devices may be employed to provide power conditioning, such as inter-phase transformers, balancing inductors, inter-phase reactors, filters, etc.

In many applications, transformer size and/or weight are important factors in realizing a practical and/or commercially successful device. For example, power converters for use in avionics typically must be lightweight and may need to occupy a small volume. Such applications, however, typically require high performance, such as high-current, low noise power conversion. Many applications may additionally, or alternatively, require low-cost power converters. Cost may be dictated by a number of factors including type of materials, amount of materials, and/or complexity of manufacture, among other factors.

Many electromagnetic devices or components generate heat during use and require cooling to keep the temperature of the device or surrounding environment sufficiently low. Certain devices, including transformers and inductors, include current carrying windings that generate a large amount of heat that needs to be dissipated. However, because the windings are often tightly wound and may be coated with an insulating material, heat generated internally must either transfer across several layers of insulation, travel through the core material (which may exhibit poor thermal conductivity) or travel along a winding conductive path and into the wiring or bussing connected to the device. None of these heat flow paths is particularly efficient.

Heat dissipation becomes increasingly important when electromagnetic devices operate at high power levels. High temperatures generated by these devices limit the power levels at which the devices can operate. Such temperature limits thus may also adversely affect the volumetric and weight performance of equipment incorporating the electromagnetic devices. This is especially true in high power density equipment operating in high ambient temperature or in applications where active cooling may be required, such as in aerospace applications. Heat sinks are known for cooling electronic equipment, but are generally only useful for removing heat from exposed surfaces of an electromagnetic device.

BRIEF SUMMARY

An electromagnetic component may be summarized as including: a core comprising a core winding portion having at least one winding surface; a winding wrapped around the core winding portion over the at least one winding surface; and a monolithic heat sink element including a heat-receiving portion positioned between the winding surface of the core and at least a portion of the winding, the heat-receiving portion of the heat sink element formed of a thermally conductive material having at least one fluid channel therein that receives a fluid.

The heat sink element may include a stack of layers of a sintered or melted material which in aggregate form the heat sink element. A first portion of the at least one fluid channel may extend in a first plane, and a second portion of the at least one fluid channel may extend in a second plane, the second plane different from the first plane. The heat-receiving portion may include at least two fluid channels therein that receive a fluid, respective first portions of the at least two fluid channels may extend in a first plane, and respective second portions of the at least two fluid channels may extend in a second plane, the second plane different from the first plane. The first plane may be an X-Y plane. The winding portion of the core may include four planar winding surfaces, and the heat-receiving portion of the heat sink element may be positioned adjacent one of the four planar winding surfaces. The heat sink element may be formed of at least one of copper, copper alloy, aluminum, or aluminum alloy. The heat-receiving portion of the heat sink element may be positioned adjacent the winding surface and under the winding. The heat-receiving portion of the heat sink element may include a first interface surface that faces at least one of the at least one winding surface, and the at least one winding surface may include a second interface surface complementary to the first interface surface of the heat-receiving portion of the heat sink element. The heat-receiving portion may be formed of a thermally conductive material having a plurality of fluid channels that each receives a fluid therethrough. The electromagnetic component may include at least one of an inductor or a transformer. The fluid channel may include a first open end and a second open end, the heat sink element may further include:

an entrance port fluidly coupled to the first end of the fluid channel; and an exit port fluidly coupled to the second end of the fluid channel.

The electromagnetic component may further include: a fluid cooling system that includes: at least one fluid pump that moves a fluid; and at least one heat exchanger fluidly coupled to the at least one fluid pump; wherein the entrance port and the exit port are fluidly coupled to the fluid pump and the heat exchanger.

The fluid in the fluid cooling system may include at least one of water, a water/glycol solution, a dielectric fluid, an oil, or a synthetic hydrocarbon fluid. The heat-receiving portion of the heat sink element may have a length and a width, and the at least one fluid channel may include a plurality of fluid channels extending parallel to each other and parallel to the length of the heat-receiving portion.

A power converter apparatus may be summarized as including: an enclosure at least partially formed of a carbon fiber-reinforced polymer; and a power converter electronics assembly disposed within the enclosure, the power converter electronics assembly including: at least one magnetic component including a core having at least one winding surface and a winding wrapped around the core over the at least one winding surface; and a monolithic heat sink element including a heat-receiving portion positioned between the winding surface of the core and at least a portion of the winding, the heat-receiving portion of the heat sink element formed of a thermally conductive material having at least one fluid channel therein that receives a fluid via a first open end and discharges the fluid via a second open end opposite the first open end.

The heat sink element may include a stack of layers of a sintered or melted material which in aggregate form the heat sink element.

A method of manufacturing an electromagnetic component may be summarized as including: providing a core comprising a core winding portion having at least one winding surface; providing a winding wrapped around the core winding portion over the at least one winding surface; providing a three-dimensional design file, the design file specifying a three-dimensional design for a monolithic heat sink element which includes a heat-receiving portion having at least one fluid channel therein that receives a fluid; providing the three-dimensional design file to an additive manufacturing system; forming the heat sink element, based on the three-dimensional design file, using the additive manufacturing system; and positioning the heat-receiving portion of the heat sink element between the winding surface of the core and at least a portion of the winding.

Forming the heat sink element may include directing a high-energy beam onto a build material in successive layers so as to bind such layers into the three-dimensional design for the heat sink element specified by the design file. Forming the heat sink element may include forming the heat sink element using an additive manufacturing process selected from a group of additive manufacturing processes comprising: direct metal laser sintering (DMLS), selective laser melting (SLM), selective laser sintering (SLS), electron beam melting (EBM), laser metal forming (LMF), laser engineered net shaping (LENS), or direct metal deposition (DMD). Forming the heat sink element may include: converting three-dimensional information in the design file into a plurality of slices that each define a cross-sectional layer of the heat sink element; and successively forming each layer of the heat sink element by fusing a metallic powder using laser energy.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION

Figure 1:
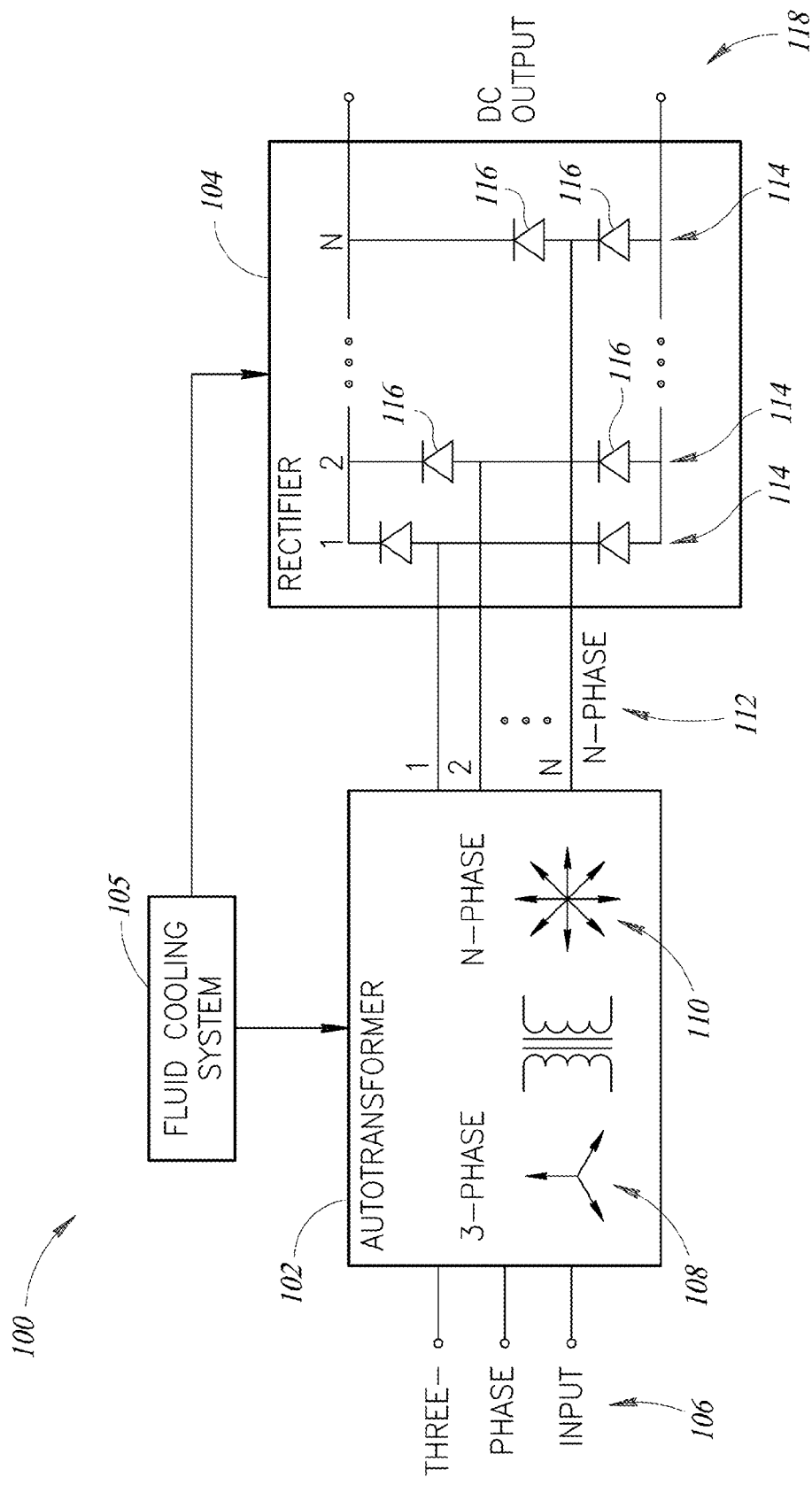
FIG. 1 is a schematic representation of a power converter, according to one illustrated embodiment.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with power electronics have not been shown or described in detail to avoid unnecessarily obscuring descriptions of the embodiments.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the context clearly dictates otherwise. It should also be noted that the term "or" is generally employed in its broadest sense, that is, as meaning "and/or" unless the context clearly dictates otherwise.

The headings and Abstract of the Disclosure provided herein are for convenience only and do not interpret the scope or meaning of the embodiments.

Embodiments of the present disclosure are directed to systems and methods that allow for weight and size reduction of electronics components, for example transformer rectifier units (TRUs) or autotransformer rectifier units (ATRUs).

In some implementations, a lightweight fluid cooling system is utilized to provide high heat dissipation for a transformer assembly of TRUs or ATRUs by providing a thermal interface at the interface between the windings of the transformer assembly and the magnetic core, which are often the hottest spots in such assemblies. The lightweight cooling system may include a fluid-cooled winding heat sink element or "finger," which may be a thermally conductive bar having microchannels therein positioned between the core and windings of a transformer or between turns of the windings of a transformer. Fluid (e.g., liquid, gas) passes through the microchannels of the heat sink fingers to provide direct cooling to the heat generating windings of the transformers.

The heat sink elements may be formed from any suitable relatively high thermal conductivity material, for example copper, aluminum, alloys (e.g., Aluminum alloys 1050A, 6061 and 6063, copper alloys). Copper may have a thermal conductivity of more than 300 watts per meter kelvin (W/(m·K)), while aluminum or aluminum alloys may have a thermal conductivity of more than 150 W/(m·K), for example.

In some implementations, the heat sink element may be produced by an additive manufacturing technology, which is the process of joining materials to make objects from three dimensional (3D) model data, usually layer upon layer, as opposed to subtractive manufacturing technologies. Non-limiting examples of additive manufacturing technologies include direct metal laser sintering (DMLS), selective laser melting (SLM), selective laser sintering (SLS), electron beam melting (EBM), laser metal forming (LMF), laser engineered net shaping (LENS), or direct metal deposition (DMD).

DMLS is an additive manufacturing process that uses a laser to sinter powdered material (e.g., metal), aiming the laser automatically at points in space defined by a 3D model and binding the material together to create a solid structure. SLM uses a comparable concept, but in SLM the material is fully melted rather than sintered, allowing different properties in the resulting product.

The DMLS process involves use of a 3D CAD model whereby a file (e.g., .STL file) is created and sent to software executing on a DMLS machine. A technician may work with the 3D model to properly orient the geometry for part building and may add supports structure as appropriate. Once this "build file" has been completed, the model is sliced into the layer thickness the machine will build in and downloaded to the DMLS machine. The DMLS machine may use a relatively high-powered laser, for example, a 200 watt Yb-fiber optic laser. Inside a build chamber area, there may be a material dispensing platform and a build platform along with a re-coater blade used to move new powder over the build platform. The technology fuses metal powder into a solid part by sintering it locally using the focused laser beam. Parts are built up additively layer-by-layer, typically using very thin layers (e.g., layers 20 micrometers thick). This process allows for highly complex geometries to be created directly from the 3D CAD data, fully automatically, in hours and without any tooling. DMLS is a net-shape process, producing parts with high accuracy and detail resolution, good surface quality and excellent mechanical properties.

One present solution uses one or two solid metal bars to conduct heat through a long path to a cold plate attached to the exterior of a transformer. Heat generated internally is also conducted through the exterior surface of a winding to the cold plate, though the heat must first conduct from the hot spot closer to the core of the transformer windings to the external surface of the coil.

In the implementations discussed herein, the heat conduction path from the heat generating elements (e.g., windings) to the cooling fluid is substantially shortened. This reduces the temperature difference between the windings and the cooling fluid.

The implementations of the present disclosure also provide a higher heat transfer rate from the transformer windings to the cooling fluid because of a higher compression force between the heat generating surfaces of the windings to the heat sink fingers. Heat conduction through interfaces is proportional to the pressure applied. This is advantageous relative to existing solutions, which may press an exterior surface of a transformer winding against a cold plate through a silicone rubber compliance material. Such material has low thermal conductivity, and the pressure applied through the interface is typically low. Thus, the implementations of the present disclosure provide much higher heat transfer efficiency.

Conventional air cooling or cold plate cooling solutions require a thermally conductive power supply enclosure ("chassis") to dissipate the generated heat. As discussed in further detail below, use of the aforementioned lightweight fluid cooling system allows for use of a carbon fiber epoxy material to form the chassis that houses a TRU or an ATRU. Advantageously, a carbon fiber epoxy chassis has lower weight and higher strength than a chassis formed of a thermally conductive material (e.g., aluminum).

FIG. 1 is a schematic representation of the building blocks of an example power converter 100 in which implementations of the present disclosure may be provided. The power converter 100 is configured to convert a three-phase AC input to a DC output. For illustration, the power converter 100 comprises a three-phase to n-phase autotransformer 102, an n-pulse rectifier 104, and a fluid cooling system 105 which may be used to cool one or more components of the autotransformer and/or the rectifier. Other forms and/or topologies of power converters may be employed The autotransformer 102 is configured to receive a three-phase input signal 106 and comprises a three-phase primary 108 and an n-phase secondary 110. The autotransformer 102 is configured to provide an n-phase AC signal 112. The rectifier 104 comprises a plurality of branches 114 coupled to respective outputs of the n-phase AC signal 112. As illustrated, each branch comprises two diodes 116. Other rectifying devices may be employed, such as thyristors, etc. The rectifier 104 produces a DC output 118.

Higher pulse rectification generally provides lower ripple on the DC output and lower AC input current distortion, and thus generally results in a higher power-quality for a power converter. Generally, a 6-pulse converter topology may be considered acceptable for use in some avionics equipment rated less than 35 VA. A 12-pulse converter topology may be generally acceptable for a significant number of aerospace applications. A 24-pulse topology may be used for higher power equipment or when a high power quality is desired or specified, for example.

Avionics applications may typically employ=TRUs or ATRUs, for example, the power converter 100 of FIG. 1, to convert a three-phase AC power source, such as a 115 Volt AC power source operating at a fixed frequency, such as 400 Hz, a 115 Volt AC 360 Hz to 800 Hz variable frequency power source, a 230 Volt AC 360 Hz to 800 Hz variable frequency power source, etc., to a DC power supply, such as a 28 Volt DC power supply, 270 Volt DC power supply, 540 Volt DC power supply, etc. The load presented to the power converter 100 may typically be between 4 amps and 400 amps, for example. Typical functions for a power converter used in avionics may include supplying short-term overloads to clear downstream faults, providing galvanic isolation between an aircraft AC power source and a DC power supply, power conditioning to provide acceptable power quality on the AC and DC sides of the power converter for proper function of the aircraft power system and electrical loads, self-monitoring and reporting of faults, etc. TRUs are used when galvanic isolation is required and/or the ratio of input to output voltage is large. TRUs are used to generate the 28 Volt DC aircraft bus from the 115 Volt AC or 230 Volt AC aircraft source power. ATRUs do not provide galvanic isolation. ATRUs are used when such isolation is not required and are most efficient when the ratio of input to output voltage is low. ATRUs are typically used to convert a 115 Volt AC 3 phase source to 270 Volt DC or a 230 Volt AC 3 phase source to 540 Volt DC, either to provide these voltages as distribution buses on an aircraft or to power large individual loads, such as motors. Power converters, such as the power converter 100 of FIG. 1, may be employed in other applications and be configured to provide other functions. TRUs and ATRUs may employ topologies using additional devices, such as inter-phase transformers, balancing inductors, inter-phase reactors, filters, etc., in order to provide the desired functionality, such as acceptable power quality.

Figure 2:
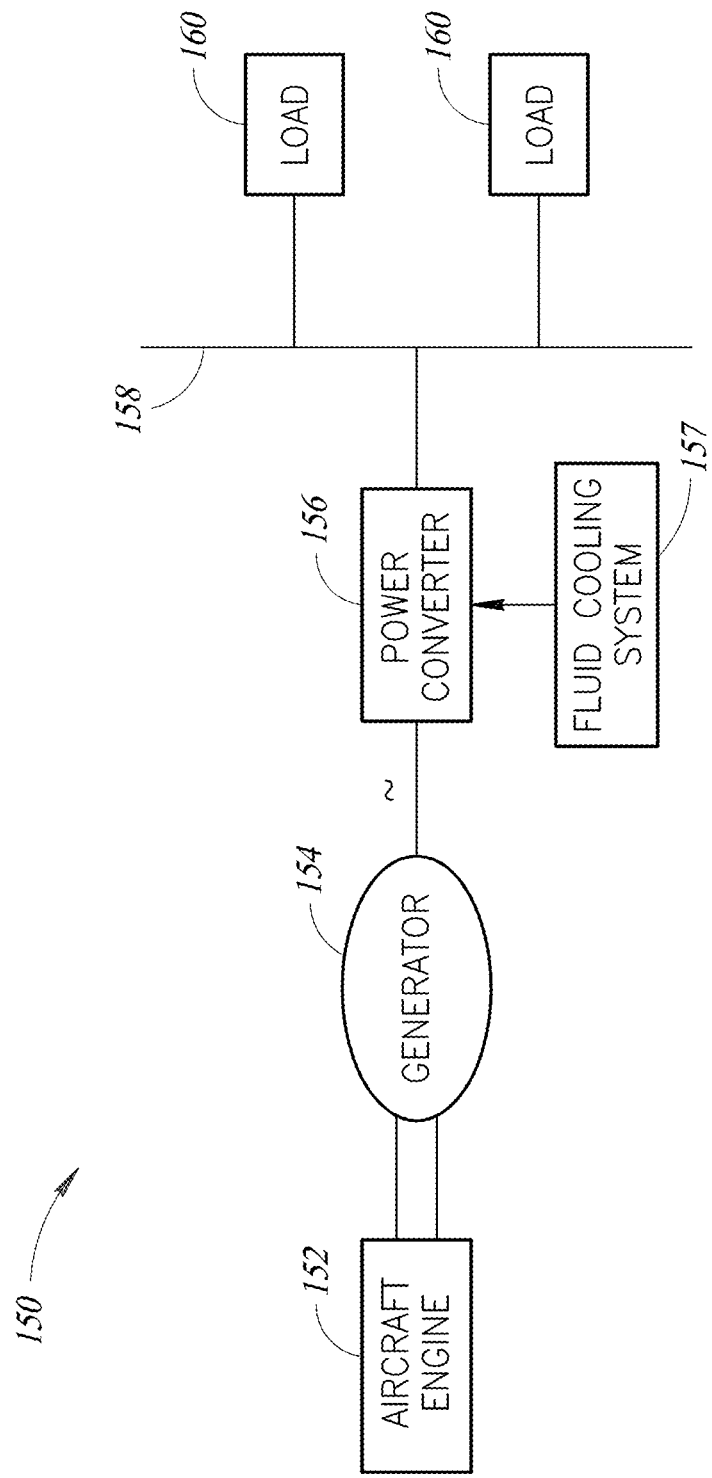
FIG. 2 is a schematic representation of an aircraft power system, according to one illustrated embodiment.

FIG. 2 is a functional block diagram of an example aircraft power system 150. As illustrated, an aircraft engine or turbine 152 drives a generator 154. The generator 154 provides an AC power signal to a power converter 156, such as the power converter 100 illustrated in FIG. 1. The power converter 156 may be cooled by a fluid cooling system 157 according to one or more of the implementations discussed below. The power generated on aircraft may be 115 Volt AC power at 400 Hz or a variable frequency, for example. Other voltage levels and frequencies may be employed. The power converter 156 is coupled to a DC bus 158 and provides a DC power signal to the DC bus. One or more loads 160, such as flight equipment, including critical flight equipment, may be coupled to the DC bus 158 and may draw power from the DC bus. Typically, flight equipment may use 28 Volt DC power to operate. Other output voltage levels may be employed.

Figure 3:
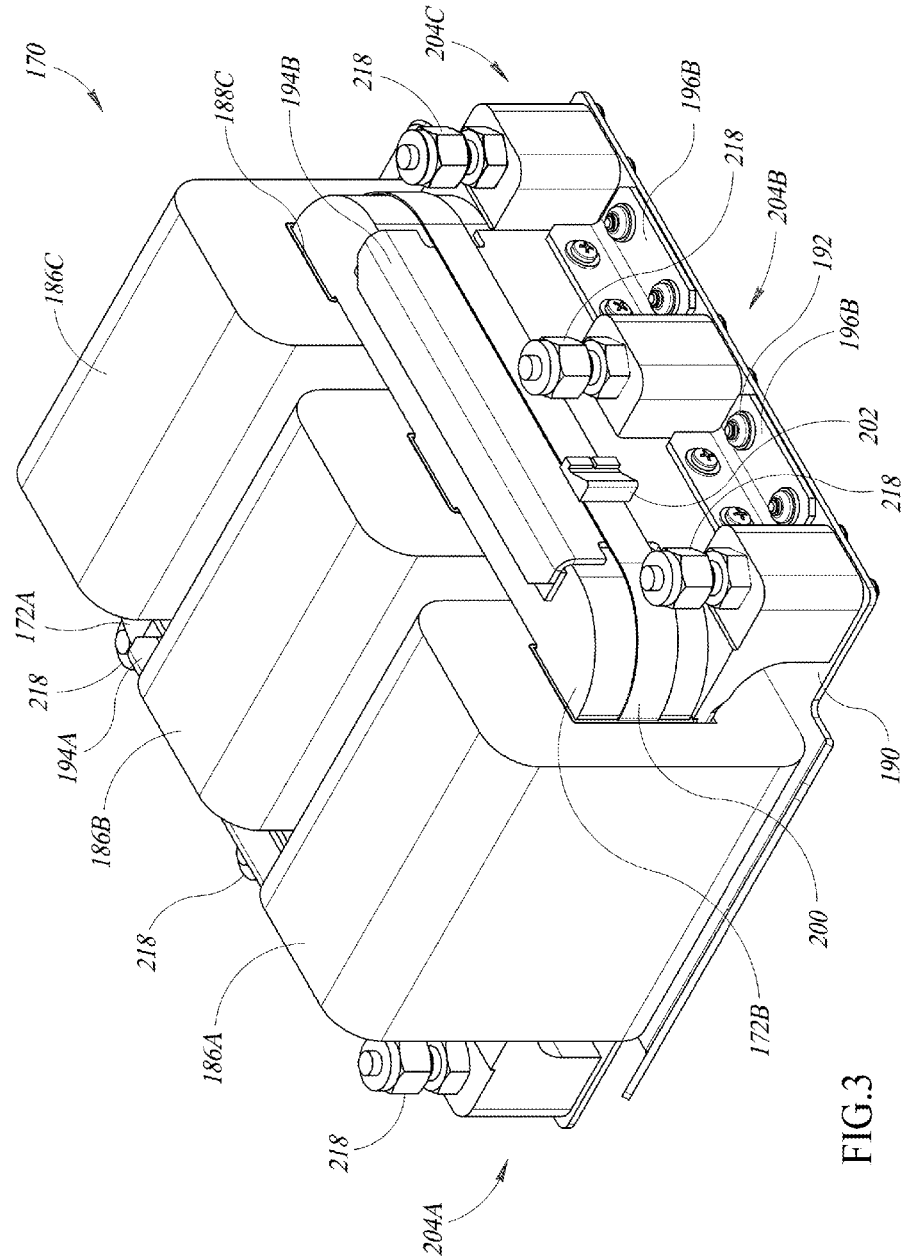
FIG. 3 is an isometric view of an electromagnetic component that includes fluid-cooled heat sink elements, according to one illustrated embodiment.
Figure 4:
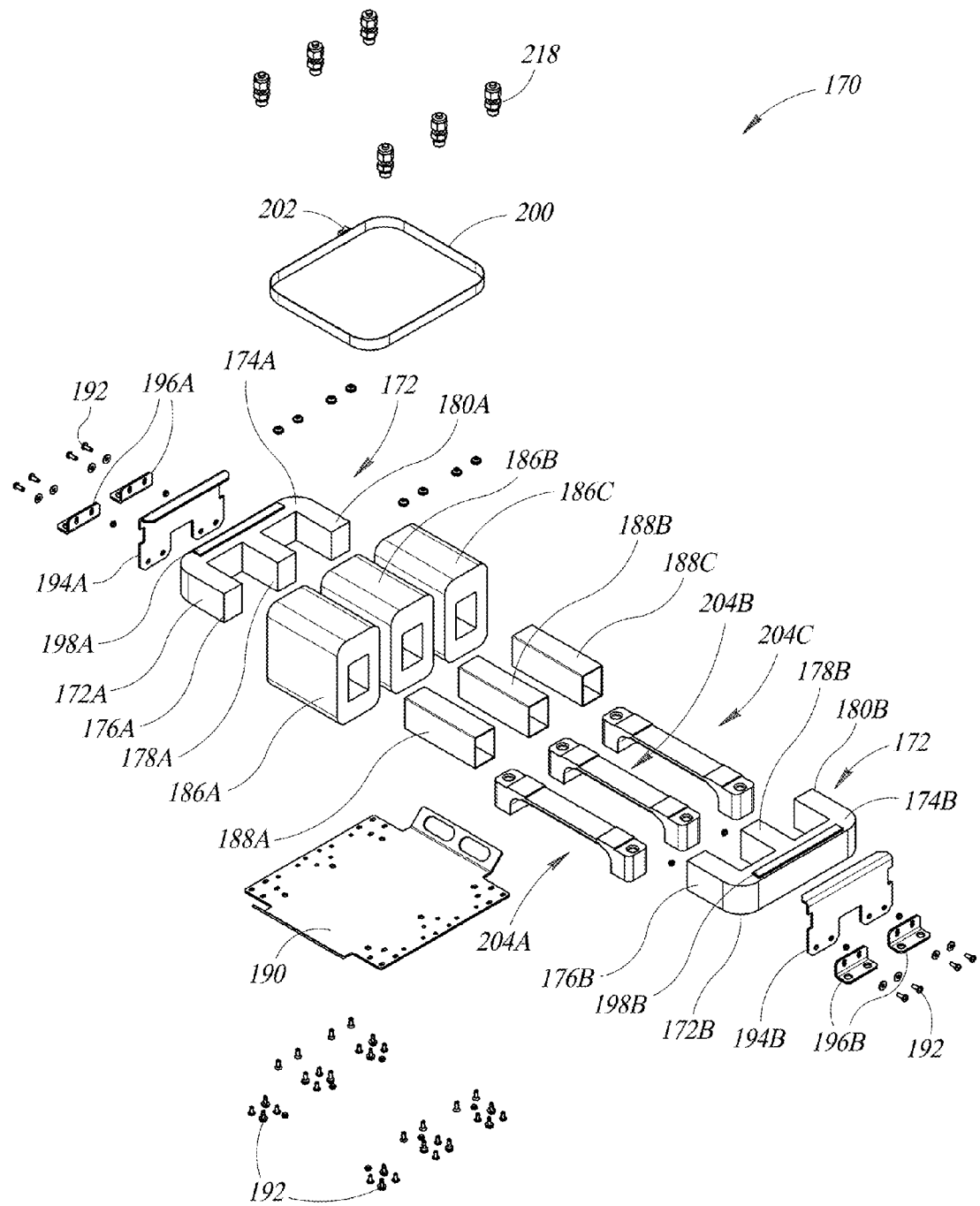
FIG. 4 is an isometric exploded view of the electromagnetic component of FIG. 3, according to one illustrated embodiment.
Figure 5:
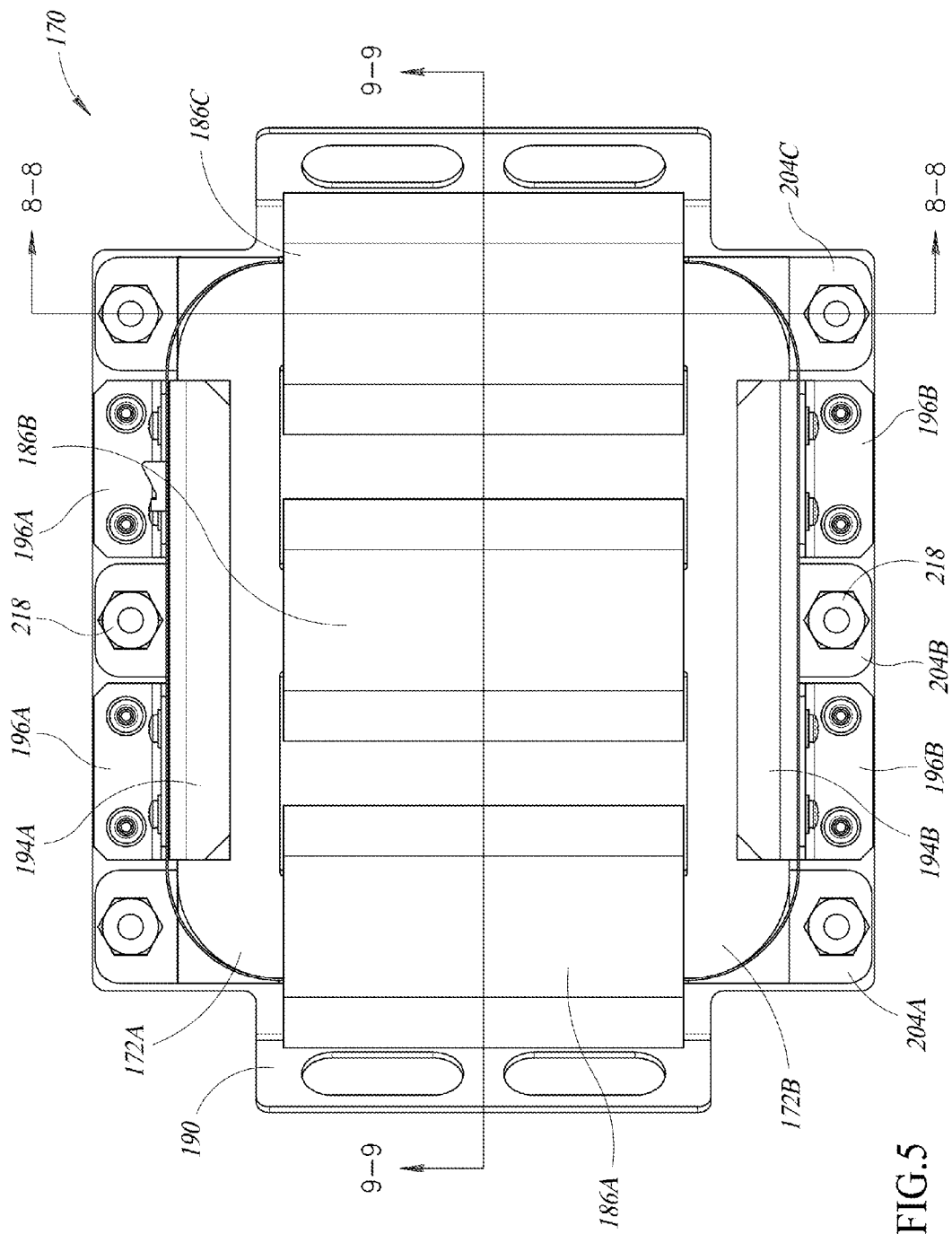
FIG. 5 is a top plan view of the electromagnetic component of FIG. 3, according to one illustrated embodiment.
Figure 6:
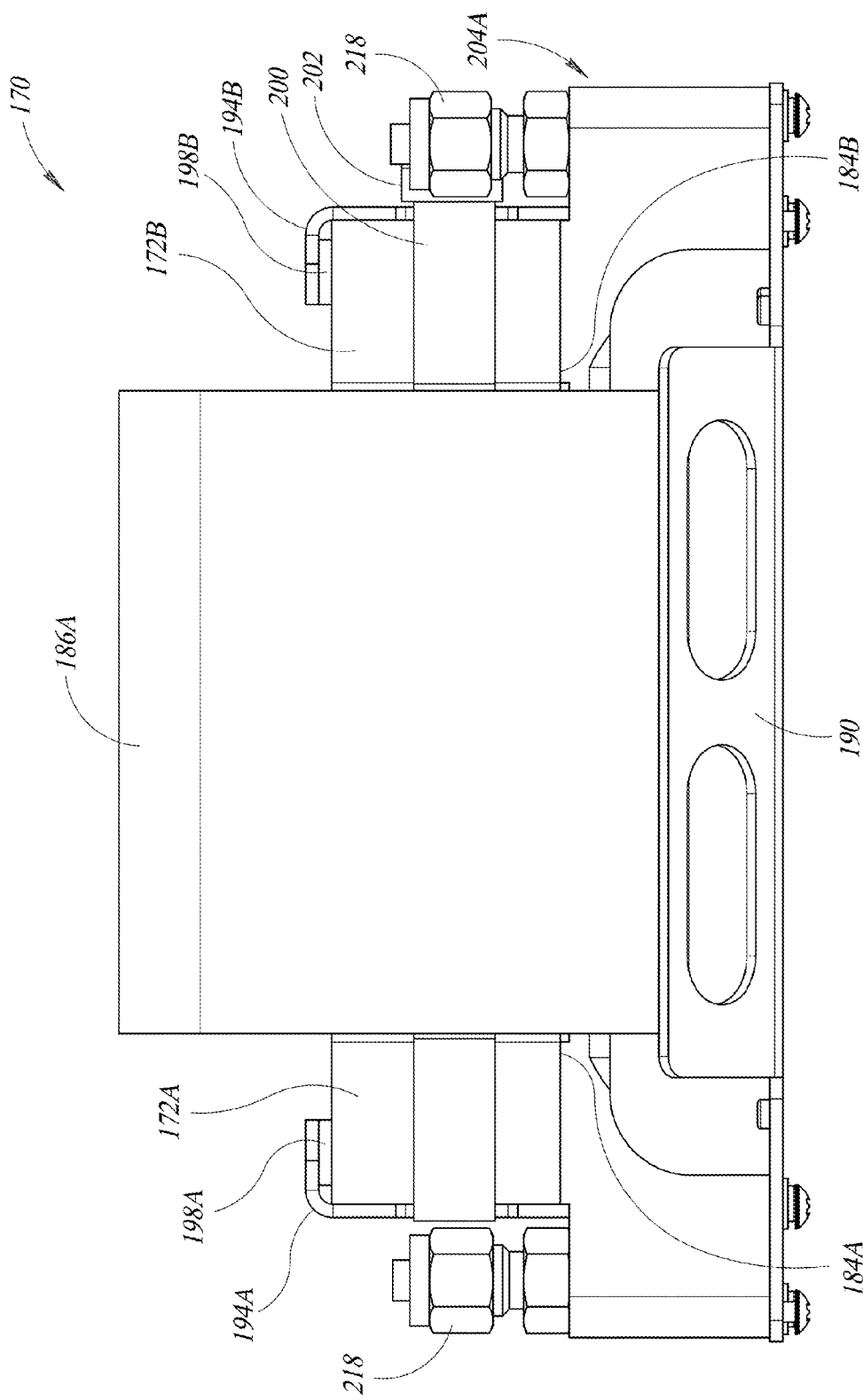
FIG. 6 is a front elevational view of the electromagnetic component of FIG. 3, according to one illustrated embodiment.
Figure 7:
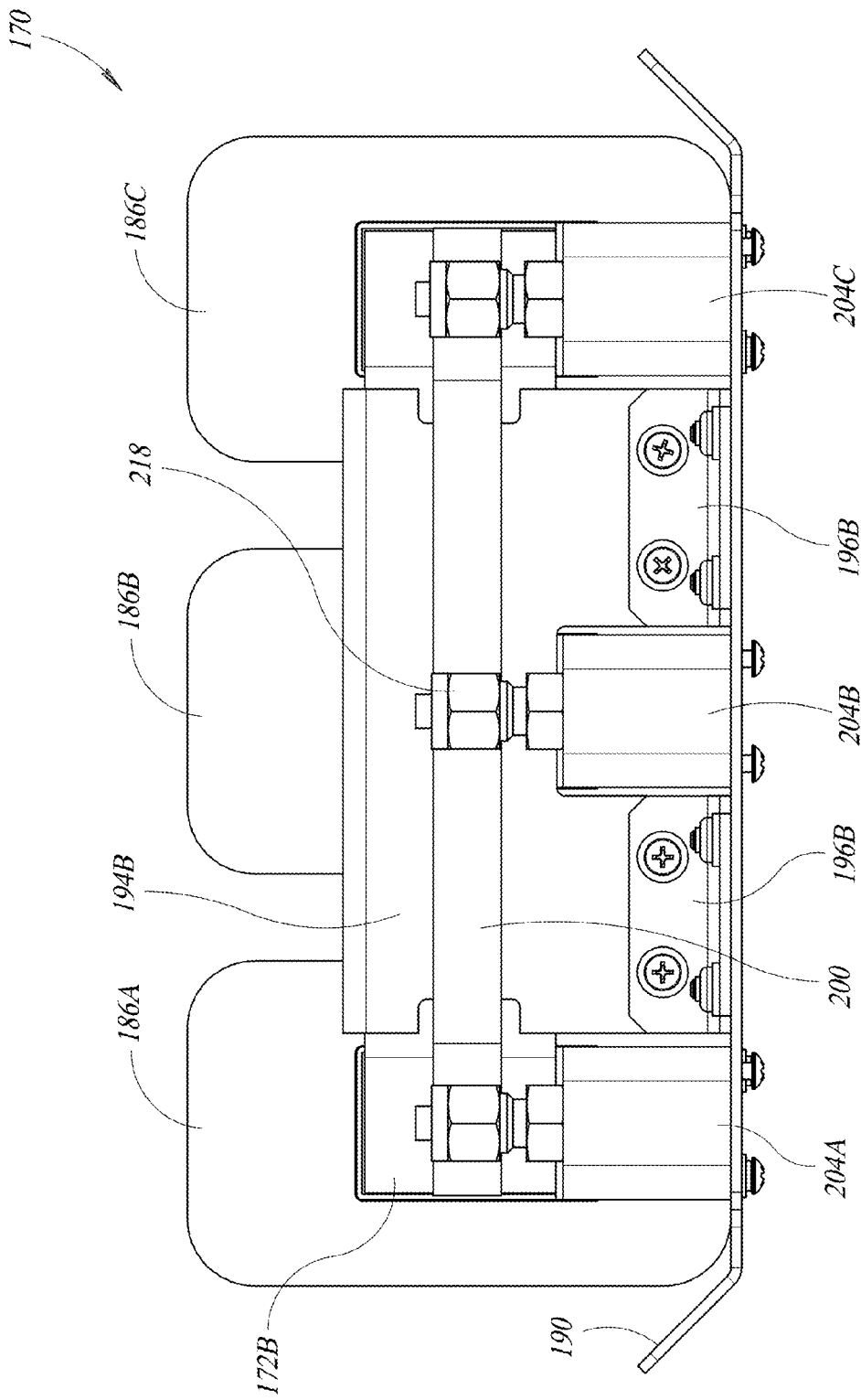
FIG. 7 is a right side elevational view of the electromagnetic component of FIG. 3, according to one illustrated embodiment.

FIGS. 3-9 show an electromagnetic device or component 170 in the form of an autotransformer. The electromagnetic component 170 may also take the form of other types of electromagnetic components, for example, a transformer or an inductor. As shown in FIG. 4, the electromagnetic component 170 includes a core element 172 comprising first and second "E-shaped" core sub-elements 172A and 172B. The first core sub-element 172A has a body portion 174A, a first outer leg 176A extending from a first end of the body portion, a second center leg 178A extending from the middle of the body portion, and a third outer leg 180A extending from a second end of the body portion opposite the first end. The first core sub-element 172A includes a top surface 182A and a bottom surface 184A (FIG. 6) opposite the top surface, "top" and "bottom" being with reference to the orientation shown in FIG. 3. The second core sub-element 172B has a body portion 174B, a first outer leg 176B extending from a first end of the body portion, a second center leg 178B extending from the middle of the body portion, and a third outer leg 180B extending from a second end of the body portion opposite the first end. The second core sub-element includes a top surface 182B and a bottom surface 184B opposite the top surface.

The legs 176A, 178A and 180A of the first core sub-element 172A are abutted against corresponding legs 176B, 178B and 180B, respectively, of the second core sub-element 172B such that the first and second core sub-elements together function as the single core element 172 having a first outer leg 176, a second center leg 178, and a third outer leg 180. In some implementations, one or more of the legs 176A, 178A and 180A of the first core sub-element 172A may be separated from a corresponding one of the legs 176B, 178B and 180B of the second core sub-element 172B by a gap, depending on the particular application for the electromagnetic component.

The core element 172 may be formed from a high permeability material, such as high permeability steel, iron, or ferrites. The core element 172 may be constructed from a solid piece of material or may be formed by stacking layers of thin laminations that are insulated from each other. Further, the core sub-elements 172A and 172B may be formed in other shapes, such as "U" shapes, "E-I" shapes, etc.

A first winding 186A, comprising a number of turns of insulated wire, is wrapped around the first leg 176 of the core element 172 over a first insulation layer 188A (FIG. 4). A second winding 186B, comprising a number of turns of insulated wire, is wrapped around the second leg 178 of the core element 172 over a second insulation layer 188B. A third winding 186C, comprising a number of turns of insulated wire, is wrapped around the third leg 180 of the core element 172 over a third insulation layer 188C. The windings 186A, 186B and 186C (collectively "windings 186") are electrically connectable to sources of power and/or loads (not shown) in a manner based on the particular application of the electromagnetic component.

The electromagnetic component 170 is shown mounted on a baseplate 190 using a plurality of fasteners 192 (e.g., screws, etc.), which baseplate may generally perform a supporting and heat sinking function. The electromagnetic component 170 may be connected to the baseplate 190 in any one of a variety manners. For example, in the illustrated embodiment, clamps 194A and 194B may be provided to secure the first and second core sub-elements 172A and 172B, respectively, to the support baseplate 190 with respective brackets 196A and 196B and one or more fasteners 192. Pads 198A and 198B are disposed on body portions 174A and 174B, respectively, of the respective core sub-elements 172A and 172B to receive the clamps 194A and 194B, respectively. The pads 198 may be formed from a silicone rubber compliance material, for example, and may function to minimize the stress or pressure imparted on the core sub-elements 172A and 172B by the clamps 194A and 194B, respectively, especially due movements or vibrations during use. The pads 198 may have an adhesive surface so that they adhere to the core sub-elements or the clamps. The pads 198 may be thermally conductive in some implementations. Further, the first core sub-element 172A and the second core sub-element 172B may be fastened together by the use of a strap or band 200, the ends of which are joined by a clip 202.

Figure 10A:
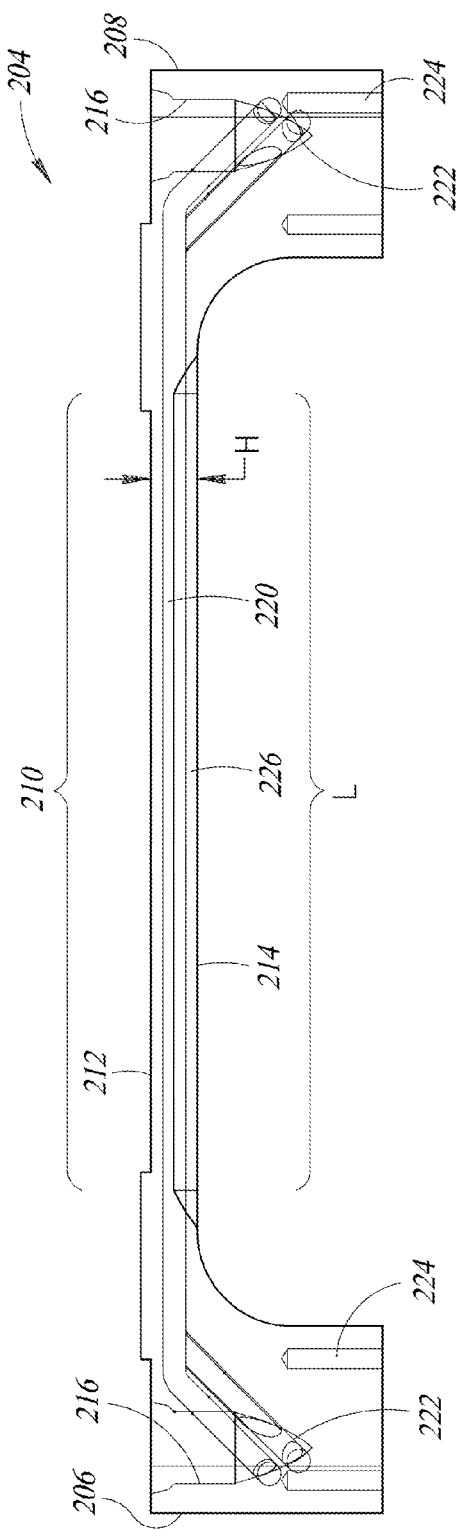
FIG. 10A is a side elevational view of a fluid-cooled heat sink element, according to one illustrated embodiment.
Figure 10B:
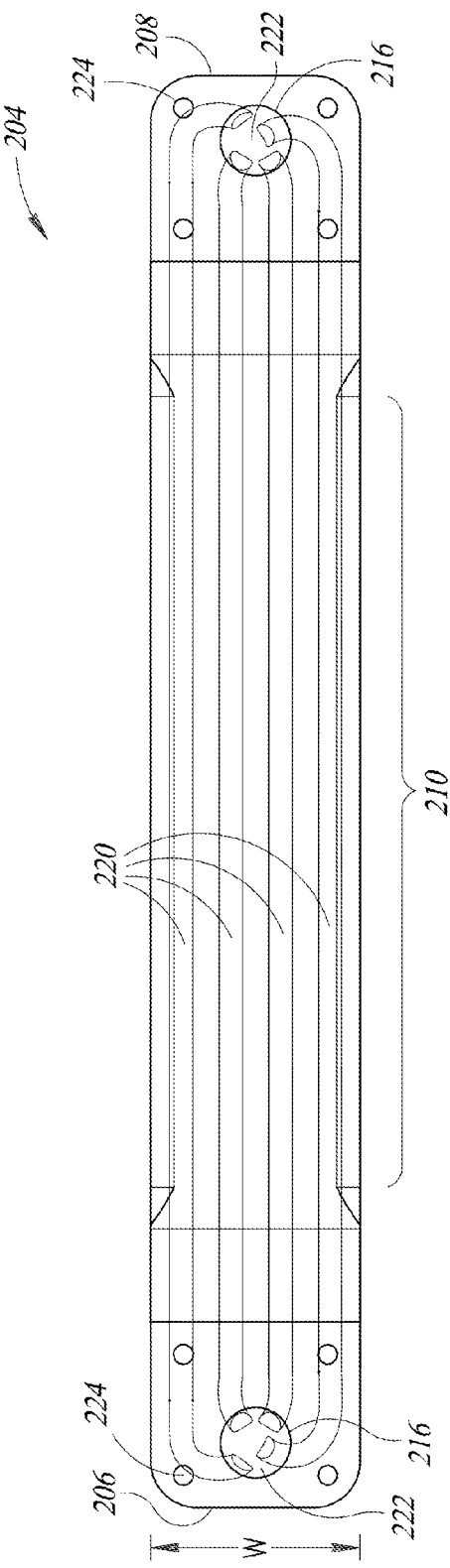
FIG. 10B is a top plan view of the fluid-cooled heat sink element, according to one illustrated embodiment.
Figure 10C:
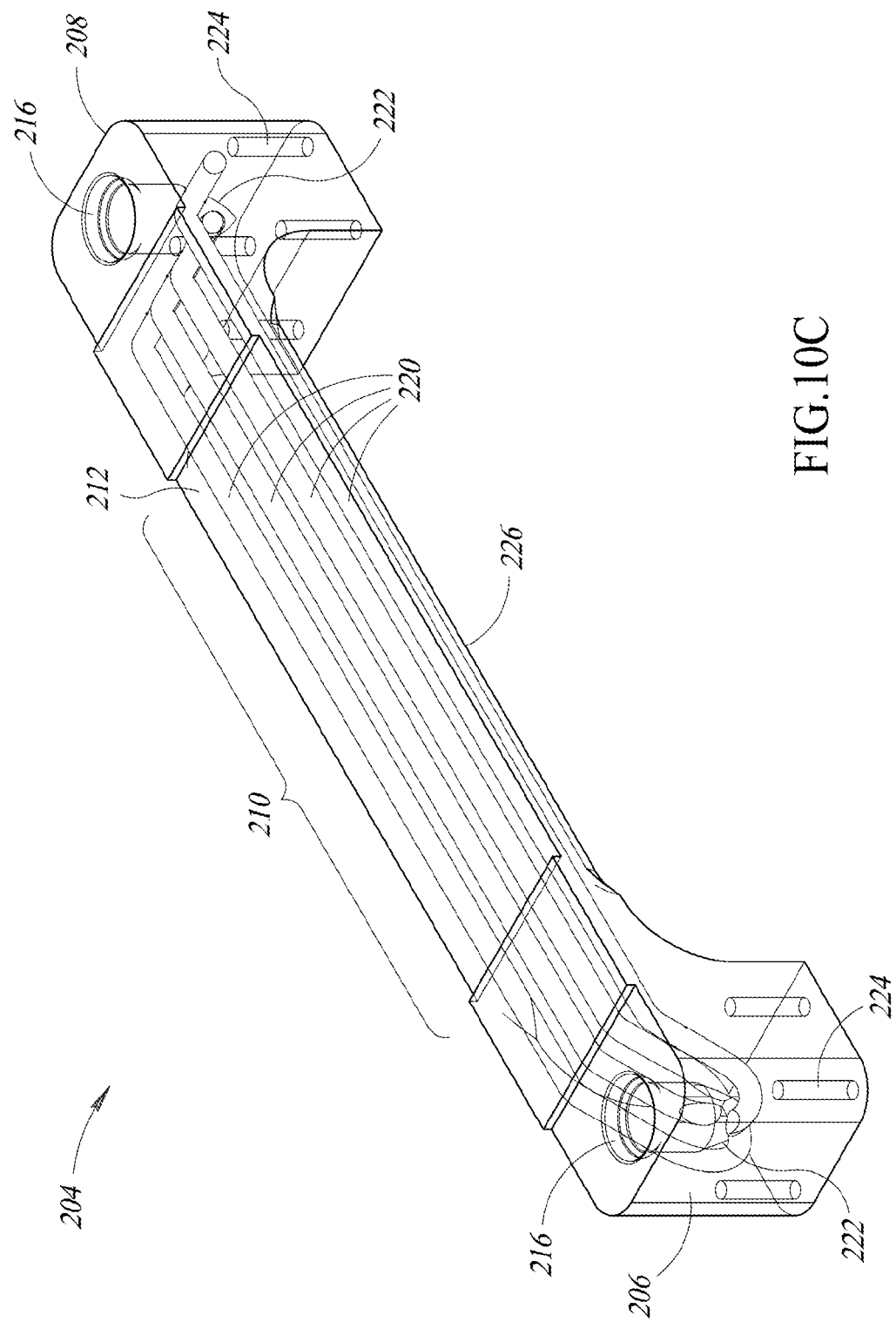
FIG. 10C is an isometric view of the fluid-cooled heat sink element, according to one illustrated embodiment.

The electromagnetic component 170 includes heat sink elements 204A, 204B and 204C (collectively "heat sink elements 204") associated with respective legs 176, 178 and 180 of the core element 172 of the electromagnetic component. The structure of the heat sink elements 204 is best illustrated in FIGS. 10A-10C. The heat sink elements 204A, 204B and 204C may be associated with the legs 176, 178, and 180, respectively, and respective windings 186A, 186B and 186C. The heat sink elements 204 may be integrally formed from a thermally conductive material, such as aluminum or copper, or other metals or metal alloys.

As shown in the partially transparent view of the heat sink element 204 in FIGS. 10A-10C, each heat sink element includes a first end portion 206 and a second end portion 208 spaced apart from the first end portion by a substantially planar thermal interface or heat-receiving portion 210. The heat-receiving portion 210 includes a top surface 212 and a bottom surface 214 spaced apart from the top surface. In the illustrated embodiment, the heat-receiving portion 210 has a length L of approximately 4.25 inches (10.8 centimeters), a width W of approximately 1.125 inches (2.86 centimeters), and a height H of approximately 0.25 inches (0.64 centimeters) between the top surface 212 and the bottom surface 214. The first and second end portions 206 and 208 include respective upward facing fluid ports 216 that are coupleable to fluid fittings 218 (FIG. 3). Four microchannels 220 extend in a parallel flow configuration between a lower portion 222 of each the fluid ports 216 across the length L of the heat-receiving portion 210. In some implementations, such as the illustrated implementation, the heat sink element 204 is manufacturing using a 3D additive manufacturing process, which allows the ability to have the microchannels 220 disposed in more than one X-Y plane. In the illustrated embodiment, the microchannels 220 have circular cross-sections and each have a diameter of approximately 0.13 inches (0.33 centimeters). Thus, the top and bottom of each of the microchannels in the heat receiving portion 210 is about 0.06 inches from the top surface 212 and the bottom surface 214, respectively, of the heat receiving portion 210. In other implementations the microchannels may have cross-sections of other shapes, for example, rectangular, square, oval, etc. The heat sink element 204 may also include one or more downward facing bores 224 that receive fasteners (e.g., screws) to secure the heat sink element to a support, such as the baseplate 190 (FIG. 4). In operation, fluid may flow into one of the fluid ports 216 of the heat sink element 204, through each of the microchannels 220, and out of the other of the fluid ports. As discussed below, one or more tubes of a fluid cooling system may be coupled to the fluid ports 216 of the heat sink elements 204 to fluidly couple the microchannels 220 of multiple heat sink elements together in one or more series or parallel configurations (see FIG. 15).

Figure 8:
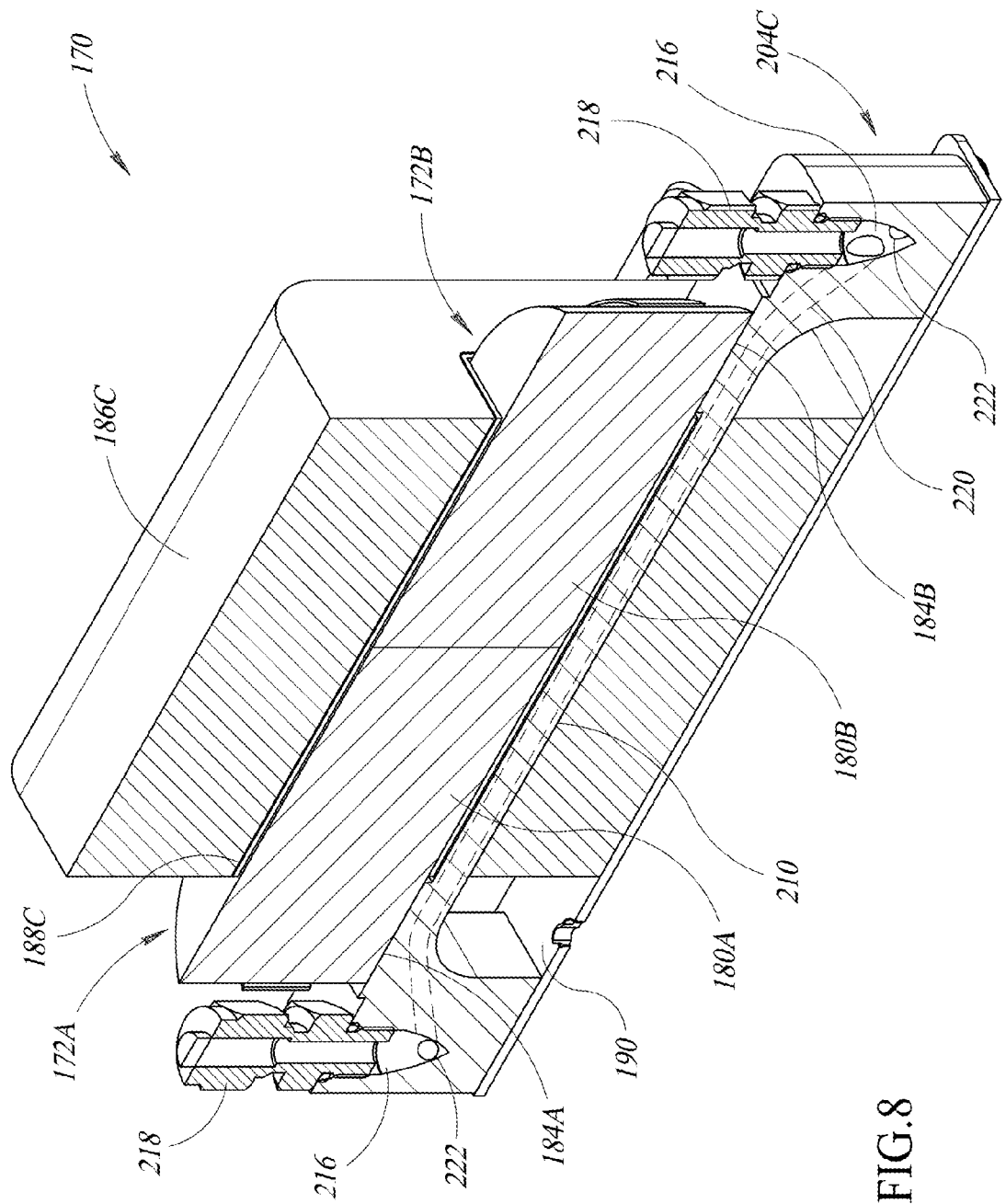
FIG. 8 is an isometric sectional view of the electromagnetic component of FIG. 3 taken along the line 8-8 of FIG. 5, according to one illustrated embodiment.
Figure 9:
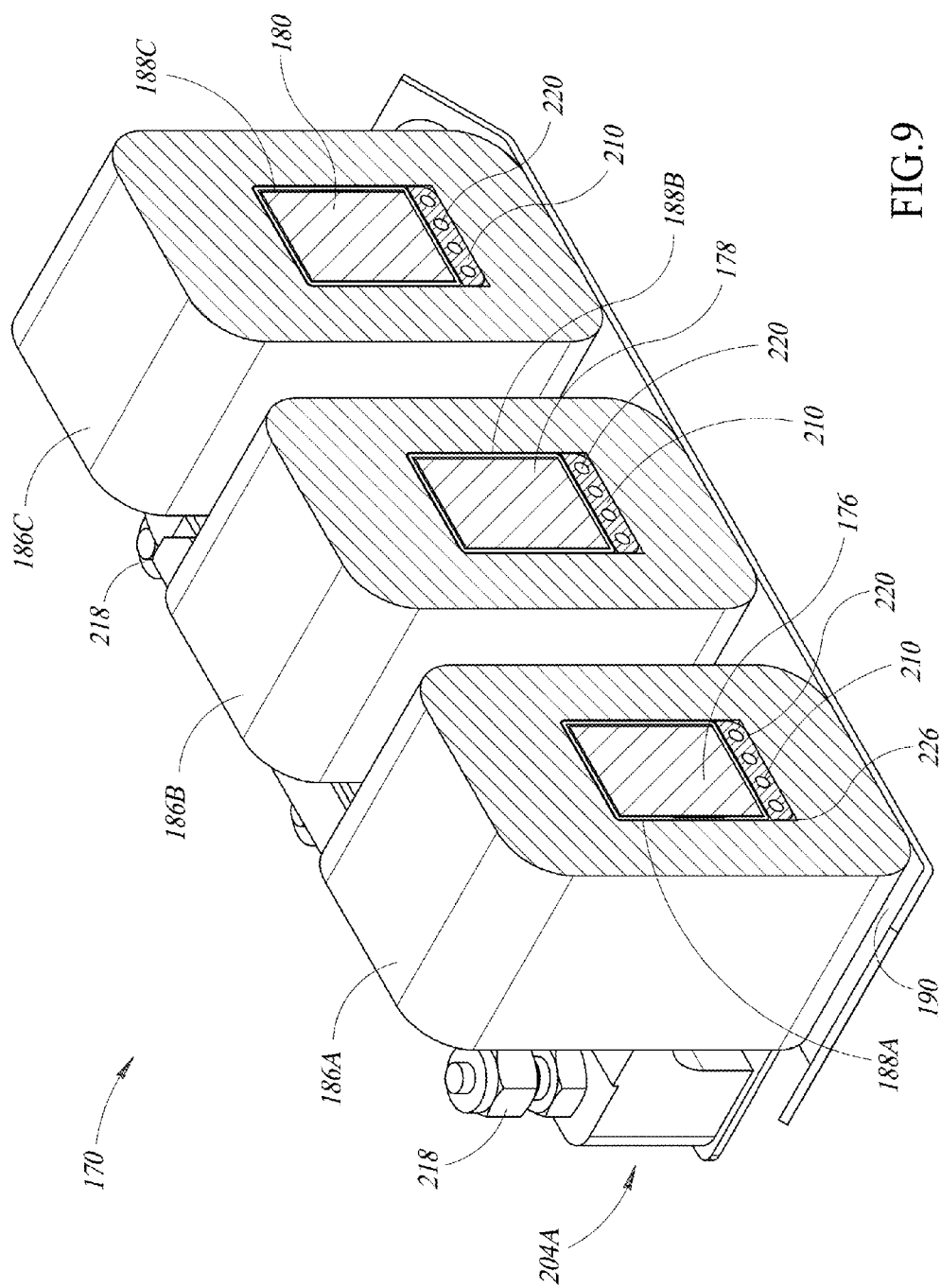
FIG. 9 is an isometric sectional view of the electromagnetic component of FIG. 3 taken along the line 9-9 of FIG. 5, according to one illustrated embodiment.

With reference to FIGS. 3, 8 and 9, the heat-receiving portion 210 of the heat sink element 204 is sized and shaped to extend between the bottom surface 184 of the first leg 176 of the core element 172 and the innermost one or more turns of the first winding 186A to conduct heat generated in the first winding outwardly from the electromagnetic component 170. As shown in FIGS. 9, and 10C, the edges 226 of the bottom surface 214 of the heat-receiving portion 210 of the heat sink element 204 may be rounded to maintain a quality thermal interface between the heat sink element and the first winding 186A and so that the innermost turns of the first winding are not damaged by otherwise sharp edges. The length L, width W and/or shape of the heat-receiving portion 210 of the heat sink element 204 may vary, but may be generally similar to the length, width and/or shape of the first leg 176 of the core element 172 around which the first winding 186A is wrapped. For example, in cases where the leg of a core element is cylindrical, the heat-receiving portion may be formed in the shape of a partial (e.g., half, quarter) cylindrical shell having an inner surface radius similar to the outer radius of the cylindrically-shaped leg of the core element so that the inner surface of the heat-receiving portion abuts at least a portion of the outer surface of the leg of the core element.

Figure 11:
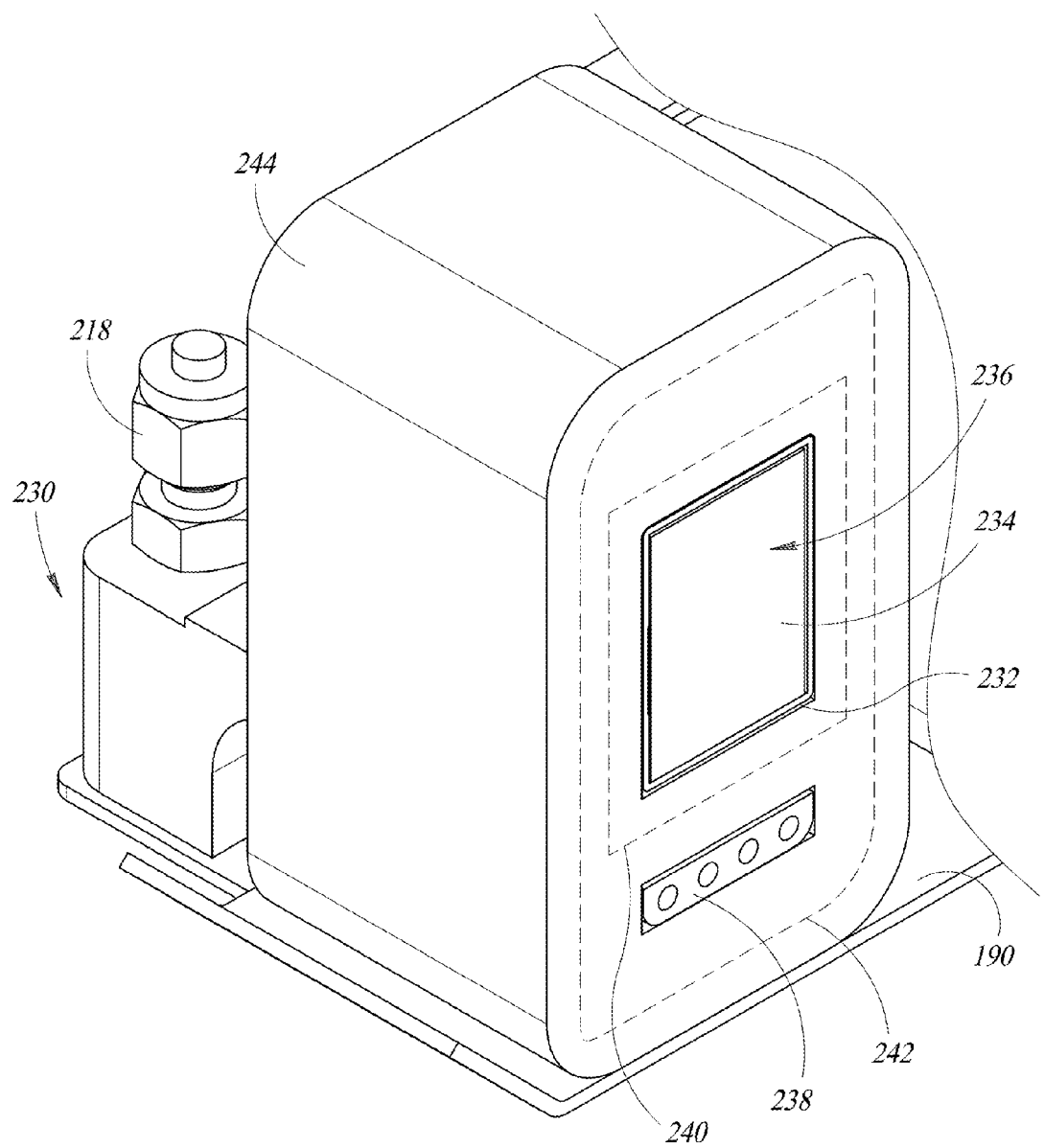
FIG. 11 is an isometric sectional view of a portion of an electromagnetic component that includes a fluid-cooled heat sink element, according to one illustrated embodiment.

FIG. 11 illustrates another implementation of a heat sink element 230 in which, rather than being adjacent a bottom surface 232 of a leg 234 of a core element 236, a heat-receiving portion 238 of the heat sink element may be sized and shaped to extend between adjacent turns 240 and 242 of a winding 244. In these implementations, both the top surface and the bottom surface of the heat-receiving portion 238 of the heat sink element 230 may be in physical contact with the winding 244.

Referring back to FIGS. 3-9, the second and third heat sink elements 204B and 204C are substantially identical to the first heat sink element 204A, so a description of the functionality of the second and third heat sink elements is not repeated herein for the sake of brevity.

The particular shape and size of the heat sink elements, as well as the shape, size and number of microchannels 220 in each heat sink element, may be selected based on factors such as the size and power level of the electromagnetic component with which the heat sink element is to be used, as well as the amount of cooling required. Further, the shape of the heat sink elements may be readily scaled to electromagnetic components of different sizes. Advantageously, because the shape of the heat sink elements generally corresponds to the footprint of the electromagnetic component in some implementations, the heat sink elements do not increase the footprint of the component an only slightly increase the volume of space occupied by the component. Thus, the heat sink elements provide effective cooling for a variety of components under a variety of conditions.

As discussed above, the clamps 194A and 194B may be provided to secure the first core sub-element 172A and the second core sub-element 172B, respectively, to the support baseplate 190 with respective brackets 196A and 196B and one or more fasteners 192. Advantageously, clamping the first and second core sub-elements 172A and 172B in this manner presses the core sub-elements, heat sink elements 204 and windings 186 more tightly together which improves thermal conduction between the windings and the heat sink elements.

Figure 12:
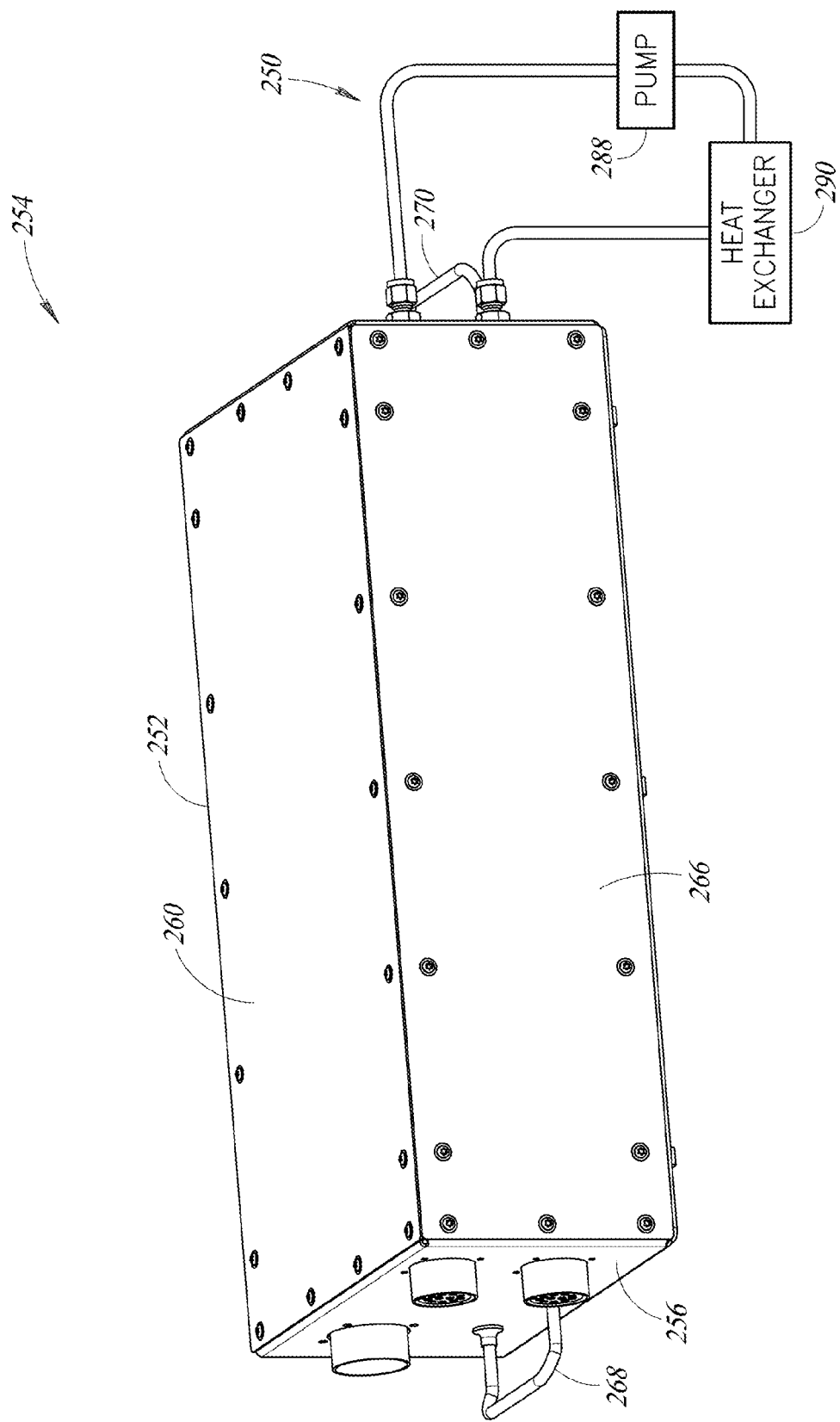
FIG. 12 is an isometric view of an autotransformer rectifier unit (ATRU) and a fluid cooling system associated with the ATRU, according to one illustrated embodiment.
Figure 13A:
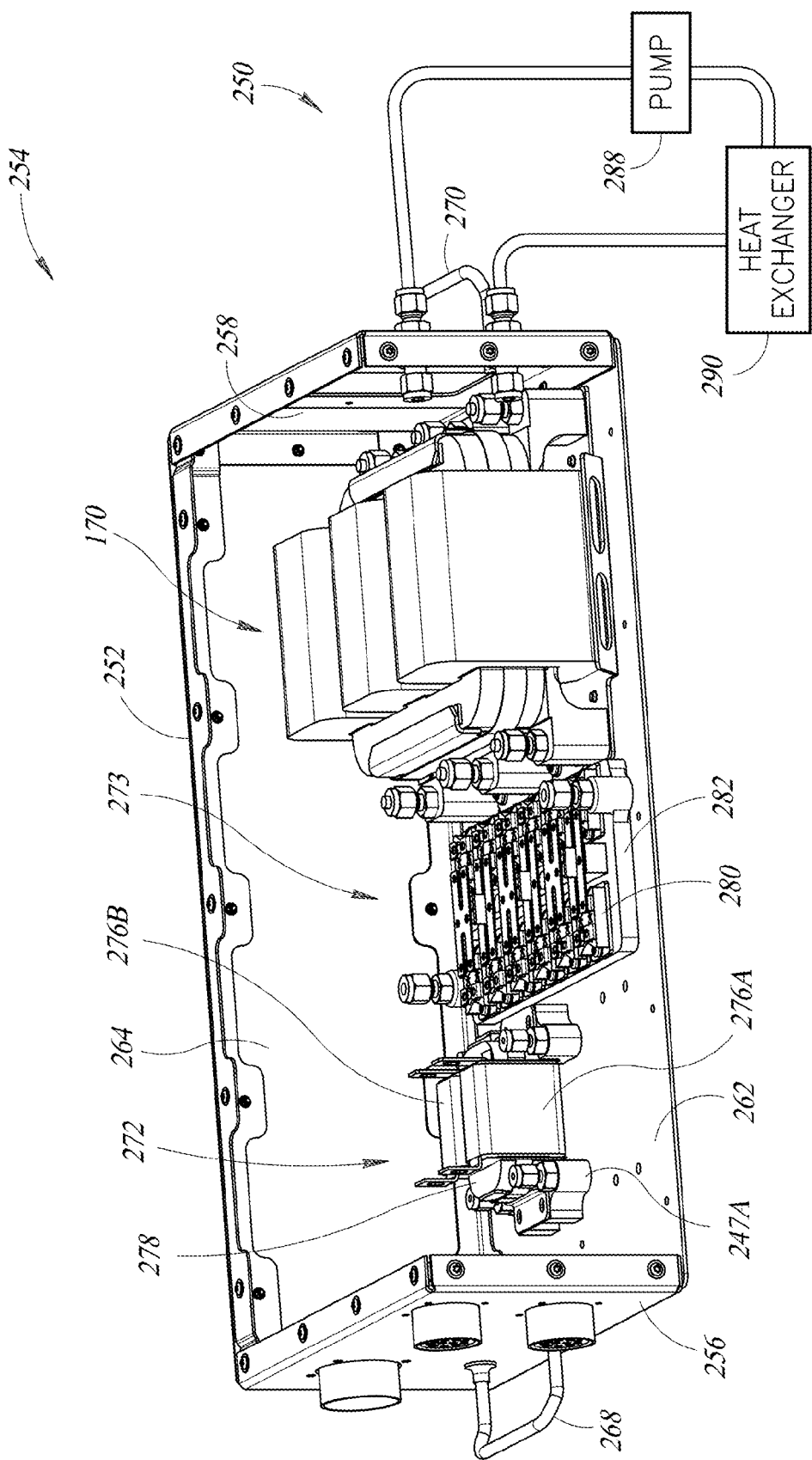
FIG. 13A is an isometric view of the ATRU and the fluid cooling system showing the internal components of the ATRU, according to one illustrated embodiment.
Figure 13B:
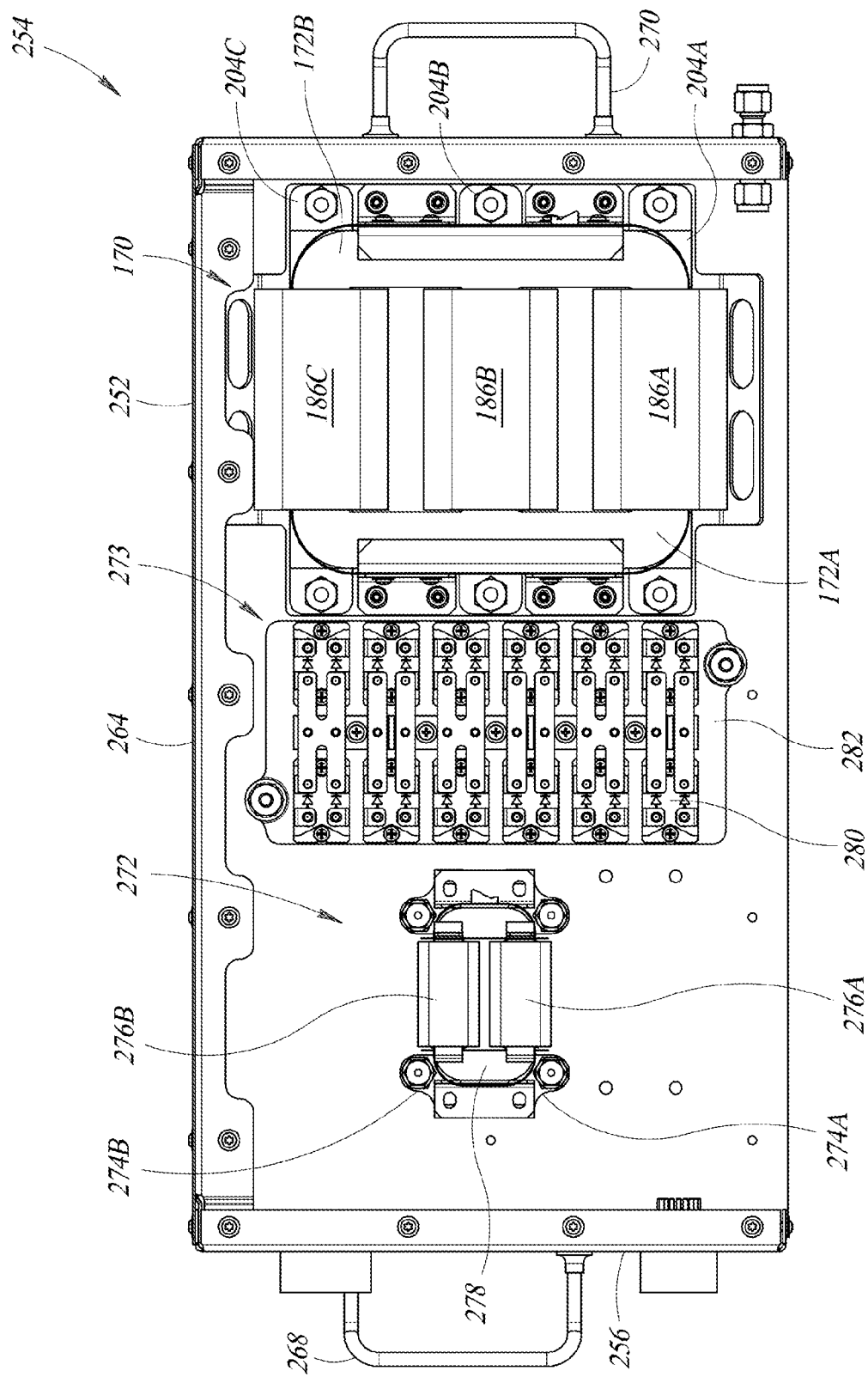
FIG. 13B is a top plan view of the ATRU and the fluid cooling system showing the internal components of the ATRU, according to one illustrated embodiment.

FIG. 12 shows a fluid cooling system 250 coupled to an enclosure or chassis 252 for an ATRU 254 that includes the electromagnetic component 170 of FIGS. 3-9. FIGS. 13A and 13B show internal components of the ATRU 254 inside the chassis 252. In the illustrated implementation, the chassis 252 is substantially rectangular in shape and is formed by a front panel 256, a rear panel 258 (FIG. 13A), a top panel 260, a bottom panel 262 (FIG. 13A), a left side panel 264 and a right side panel 266. The chassis 252 also includes handles 268 and 270 positioned on the front panel 256 and the rear panel 258, respectively, to allow a user to more easily carry and transport the ATRU 254.

As shown in FIGS. 13A and 13B, the ATRU 254 includes the electromagnetic component 170 of FIGS. 3-9, an electromagnetic component 272 which may, for example, be an interphase transformer, and a rectifier unit 273. The parts of the electromagnetic component 170 are discussed above. The electromagnetic component 272 is similar to the electromagnetic component 170 in many respects, so a detailed discussion of the electromagnetic component 272 is not required.

The electromagnetic component 272 includes heat sink elements 274A and 274B (see FIG. 15) positioned adjacent respective windings 276A and 276B of the electromagnetic component below respective legs of a core element 278 thereof. The heat sink elements 274A and 274B are similar to the heat sink elements 204 of the electromagnetic component 170 of FIGS. 3-9 and include similar fluid-carrying microchannels (not shown) that allow fluid flowing therethrough to dissipate heat generated in the windings 276A and 276B. Fluid fittings 218 are coupled the heat sink elements 274A and 274B so that tubes of the fluid cooling system 250 may be fluidly coupled to the microchannels inside the heat sink elements.

Figure 14:
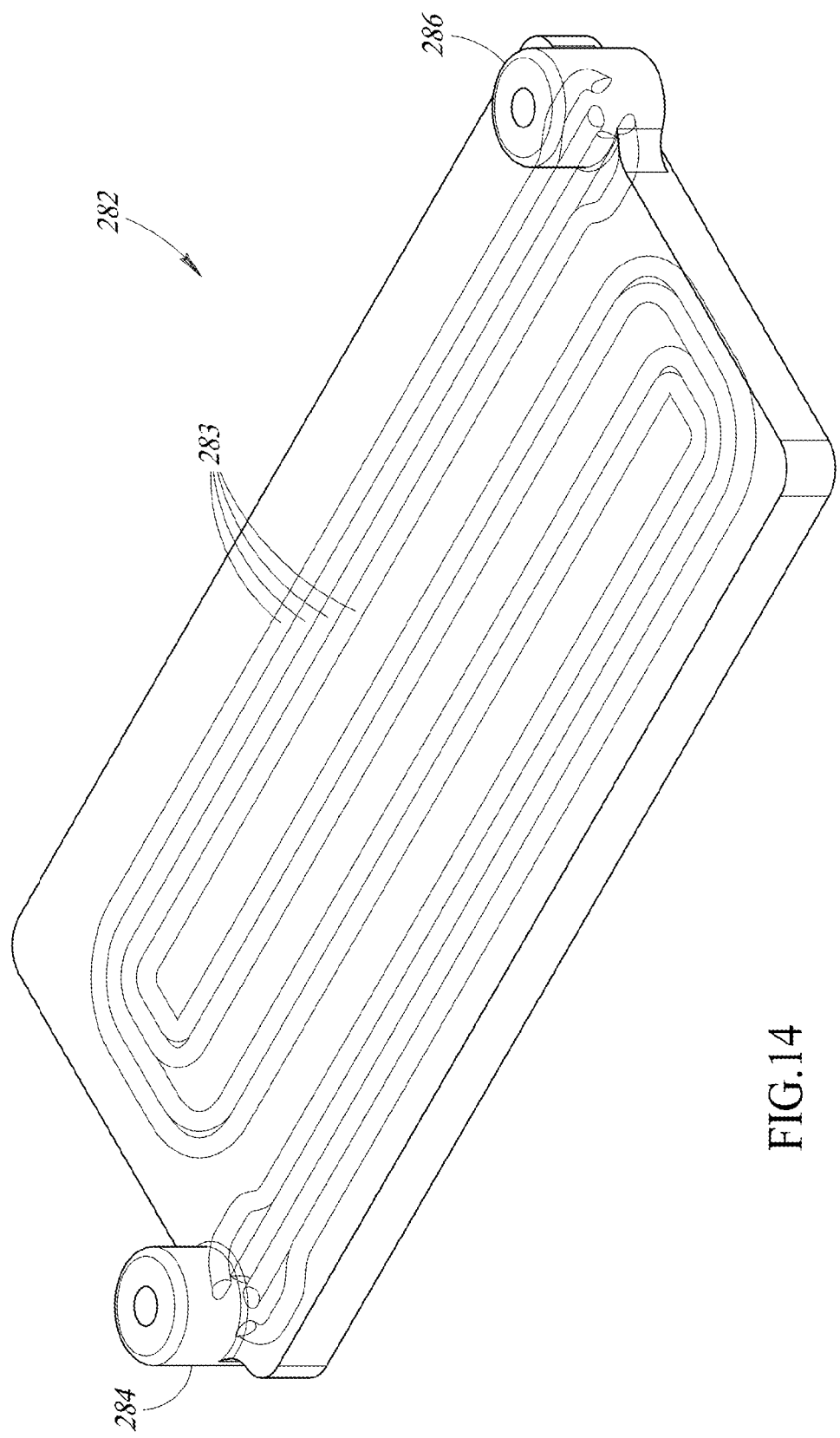
FIG. 14 is an isometric view of a rectifier heat sink base plate of the ATRU that includes a plurality of fluid channels, according to one illustrated embodiment.

The rectifier unit 273 includes a plurality of diodes 280 fastened to a heat sink base plate 282. As shown in FIG. 14, which depicts an isometric partially transparent view of the heat sink base plate 282, the base plate includes a plurality of microchannels 283 extending between a first fluid port 284 and a second fluid port 286. In some implementations, the heat sink base plate 282 may be produced by an additive manufacturing process, similar to the heat sink elements 204 and 274 associated with the electromagnetic components 170 and 272, respectively. Referring back to FIG. 13A, the fluid ports 284 and 286 of the heat sink base plate 282 may be coupled to fluid fittings 218 which may be coupled to tubes or pipes of the fluid cooling system 250.

The fluid cooling system 250 may include a fluid pump 288 to circulate fluid through the network of tubes and heat sink elements. The fluid cooling system 250 may also include a heat exchanger 290 (e.g., radiator) fluidly coupled to the pump that cools the fluid flowing therethrough.

Figure 15:
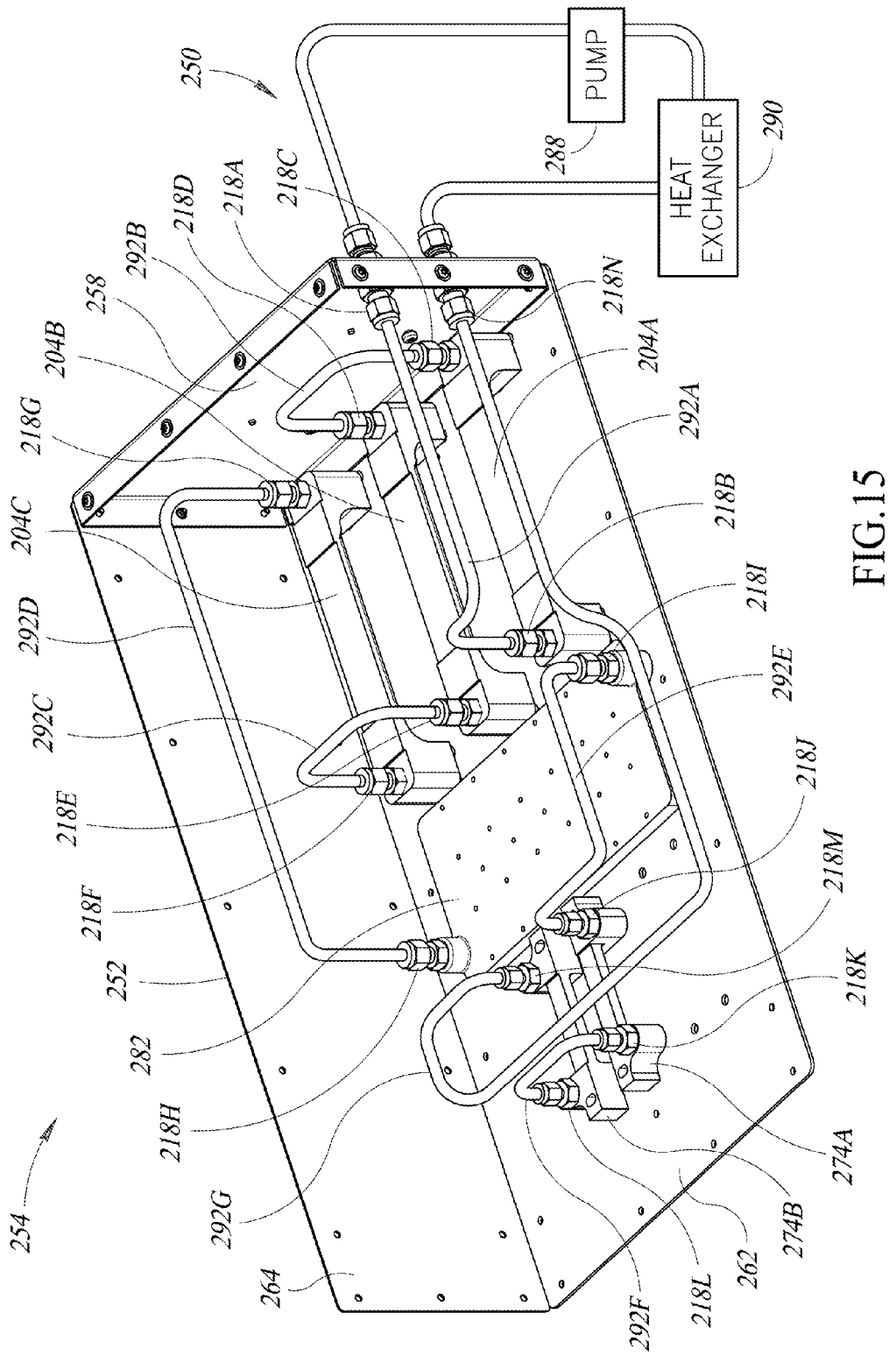
FIG. 15 is an isometric view of components of the fluid cooling system of the ATRU, according to one illustrated embodiment.

FIG. 15 illustrates an example configuration for the connections of the fluid cooling system 250. In this illustration, fluid may enter the chassis 252 at the rear panel 258 via an entrance fluid fitting 218A. The entrance fluid fitting 218A is coupled to a tube 292A that is in turn coupled to a fluid fitting 218B at a near end (as shown) of the heat sink element 204A associated with the electromagnetic component 170. A tube 292B couples the far ends of heat sink elements 204A and 204B together via fittings 218C and 218D and a tube 292C couples the near ends of heat sink elements 204B and 204C together via fittings 218E and 218F such that the fluid may flow serially through the heat sink elements 204A, 204B and 204C. A tube 292D at the far end of the heat sink element 204C is coupled to a fluid fitting 218G at the far end of the heat sink element 204C and to a first fluid fitting 218H of the rectifier heat sink base plate 282. Another tube 292E is coupled between a second fluid fitting 218I of the rectifier heat sink base plate 282 and a fluid fitting 218J of the heat sink element 274A of the electromagnetic component 272. A tube 292F coupled to fluid fittings 218K and 218L at the near ends of the heat sink elements 274A and 274B, respectively, allows fluid to flow serially through the heat sink elements. A tube 292G at the far end of the heat sink element 274B is coupled between a fluid fitting 218M and an exit fluid fitting 218N coupled to the rear panel 258 of the chassis 252. The tubes 274 or the channels described herein may have a cross-sectional shape that is circular, rectangular, or any other shape.

Using this example configuration, fluid may be circulated through the various heat sink elements of the ATRU 254.

The panels 256, 258, 260, 262, 264, 266 of chassis 252 are formed from a carbon fiber epoxy material, which substantially reduces the weight of the ATRU 254 while simultaneously increasing its durability compared to a chassis made of a thermally conductive material such as aluminum. As noted above, the heat sink elements dissipate sufficient heat such that the ATRU 254 does not require a thermally conductive chassis. The carbon fiber epoxy chassis 252 in combination with the fluid cooling system 250 of the present disclosure advantageously provide a 30% to 50% weight reduction for the mechanical and structural portion of the ATRU 254 compared to a conventional ATRU. By directly cooling the hottest spots of a magnetic device, such device can be redesigned for a smaller size, further improving the size and weight reductions.

Further, while implementations of the present disclosure may be targeted at relatively large magnetic devices in ATRUs or TRUs having output power of 5 kilowatts and higher (e.g., 50 kilowatts), the implementations may also be applied to other magnetic devices of different sizes.

Implementations of the present disclosure minimize the size of a fluid-cooled heat sink element and place such heat sink element directly where it is most effective. As discussed above, the heat-receiving portions or fingers of the heat sink elements are built into the magnetic component and are located between the winding and the core or, optionally, part way through the winding.

Additive manufacturing processes employing 3D metal printing may be used to produce the heat sink elements, which provide benefits that either cannot be achieved using other methods (e.g., conventional machining) or would require additional acts. Among these benefits are the ability to have the cooling channels in more than one X-Y plane and the benefit of the inherent surface roughness of 3D printed channels in creating turbulent rather than laminar flow. In particular, the surface roughness created by the 3D printing process creates a higher heat transfer rate to the fluid compared to traditional machining processes. Further, at certain linear fluid velocities and viscosities, the rough surface generates lower frictions, thus producing lower pressure losses in the fluid cooling system.

Further, 3D printed heat sink elements may have dimensional channels that are more streamlined to the flow of fluid, which generates less resistance and reduces pressure losses. 3D printed fluid channels also allow fluid to pass through traditionally difficult to reach areas to provide direct cooling to hot spots in such areas. Moreover, small areas, such as a 3D radius, that are important to fluid pressure losses may be implemented freely without restrictions of special tooling and/or tool access. Generally, the cross sections of the fluid channels of 3D printed heat sink elements may be selected freely, so the channels may have the smallest thickness possible.

Additionally, 3D printed heat sink elements have a much higher density than heat sink elements produced by conventional methods, such as casting and/or brazing. Accordingly, porosities in 3D printed heat sink elements are less of a concern. Thus, the walls of 3D printed heat sink elements may be designed to be thinner than the walls of heat sink elements manufactured using conventional methods, which reduces the total size of the 3D printed heat sink elements.

Alternatively, a larger heat sink element may be provided that has cooling channels only in one X-Y plane where the heat sink element is made in two halves using traditional machining that are bonded together during manufacturing. These heat sink elements can be connected together in series with microchannel heat sinks that may be required for cooling other components in the assembly. These other heat sinks may be produced with either additive manufacturing technology or with traditional machining techniques.

The foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative embodiment applies equally regardless of the particular type of nontransitory signal bearing media used to actually carry out the distribution. Examples of nontransitory signal bearing media include, but are not limited to, the following: recordable type media such as floppy disks, hard disk drives, CD ROMs, digital tape, and computer memory.

The various embodiments described above can be combined to provide further embodiments. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electromagnetic component, comprising:
   a core comprising a core winding portion having at least one winding surface;
   a winding wrapped around the core winding portion over the at least one winding surface; and
   a monolithic heat sink element including a heat-receiving portion positioned between the winding surface of the core and at least a portion of the winding, the heat-receiving portion of the heat sink element formed of a thermally conductive material having at least one closed fluid channel therein which receives a flow of liquid therethrough, a first portion of the at least one fluid channel extends in a first plane, and a second portion of the at least one fluid channel extends in a second plane, the second plane different from the first plane.

2. The electromagnetic component of claim 1 wherein the heat sink element comprises a stack of layers of a sintered or melted material which in aggregate form the heat sink element.

3. The electromagnetic component of claim 1 wherein the heat-receiving portion includes at least two fluid channels therein that receive a flow of liquid therethrough, respective first portions of the at least two fluid channels extend in a first plane, and respective second portions of the at least two fluid channels extend in a second plane, the second plane different from the first plane.

4. The electromagnetic component of claim 3 wherein the first plane is an X-Y plane.

5. The electromagnetic component of claim 1 wherein the core winding portion includes four planar winding surfaces, and the heat-receiving portion of the heat sink element is positioned adjacent one of the four planar winding surfaces.

6. The electromagnetic component of claim 1 wherein the heat sink element is formed of at least one of copper, copper alloy, aluminum, or aluminum alloy.

7. The electromagnetic component of claim 1 wherein the heat-receiving portion of the heat sink element is positioned adjacent the winding surface and under the winding.

8. The electromagnetic component of claim 1 wherein the heat-receiving portion of the heat sink element includes a first interface surface that faces at least one of the at least one winding surface, and the at least one winding surface includes a second interface surface complementary to the first interface surface of the heat-receiving portion of the heat sink element.

9. The electromagnetic component of claim 1 wherein the heat-receiving portion is formed of a thermally conductive material having a plurality of fluid channels that each receives a liquid therethrough.

10. The electromagnetic component of claim 1 wherein the electromagnetic component comprises at least one of an inductor or a transformer.

11. The electromagnetic component of claim 1 wherein the fluid channel includes a first open end and a second open end, the heat sink element further comprising:
    an entrance port fluidly coupled to the first end of the fluid channel; and
    an exit port fluidly coupled to the second end of the fluid channel.

12. The electromagnetic component of claim 11, further comprising:
    a fluid cooling system that includes:
        at least one fluid pump that moves a fluid; and
        at least one heat exchanger fluidly coupled to the at least one fluid pump;
        wherein the entrance port and the exit port are fluidly coupled to the fluid pump and the heat exchanger.

13. The electromagnetic component of claim 12 wherein the fluid in the fluid cooling system comprises at least one of water, a water/glycol solution, a dielectric fluid, an oil, or a synthetic hydrocarbon fluid.

14. The electromagnetic component of claim 1 wherein the heat-receiving portion of the heat sink element has a length and a width, and the at least one fluid channel comprises a plurality of fluid channels extending parallel to each other and parallel to the length of the heat-receiving portion.

15. A power converter apparatus, comprising:
    an enclosure at least partially formed of a carbon fiber-reinforced polymer; and
    a power converter electronics assembly disposed within the enclosure, the power converter electronics assembly including:
        at least one magnetic component including a core having at least one winding surface and a winding wrapped around the core over the at least one winding surface; and a monolithic heat sink element including a heat-receiving portion positioned between the winding surface of the core and at least a portion of the winding, the heat-receiving portion of the heat sink element formed of a thermally conductive material having at least one fluid channel therein that receives a fluid via a first open end and discharges the fluid via a second open end opposite the first open end.

16. The power converter apparatus of claim 15 wherein the heat sink element comprises a stack of layers of a sintered or melted material which in aggregate form the heat sink element.

17. A method of manufacturing an electromagnetic component, the method comprising:
providing a core comprising a core winding portion having at least one winding surface;
providing a winding wrapped around the core winding portion over the at least one winding surface;
providing a three-dimensional design file, the design file specifying a three-dimensional design for a monolithic heat sink element which includes a heat-receiving portion having at least one closed fluid channel therein which receives a flow of liquid therethrough, a first portion of the at least one fluid channel extends in a first plane, and a second portion of the at least one fluid channel extends in a second plane, the second plane different from the first plane;
providing the three-dimensional design file to an additive manufacturing system;
forming the heat sink element, based on the three-dimensional design file, using the additive manufacturing system; and
positioning the heat-receiving portion of the heat sink element between the winding surface of the core and at least a portion of the winding.

18. The method of claim 17 wherein forming the heat sink element comprises directing a high-energy beam onto a build material in successive layers so as to bind such layers into the three-dimensional design for the heat sink element specified by the design file.

19. The method of claim 17 wherein forming the heat sink element comprises forming the heat sink element using an additive manufacturing process selected from a group of additive manufacturing processes comprising: direct metal laser sintering (DMLS), selective laser melting (SLM), selective laser sintering (SLS), electron beam melting (EBM), laser metal forming (LMF), laser engineered net shaping (LENS), or direct metal deposition (DMD).

20. The method of claim 17 wherein forming the heat sink element comprises:
converting three-dimensional information in the design file into a plurality of slices that each define a cross-sectional layer of the heat sink element; and
successively forming each layer of the heat sink element by fusing a metallic powder using laser energy.

21. A method of manufacturing an electromagnetic component, the method comprising:
providing a core comprising a core winding portion having at least one winding surface;
providing a winding wrapped around the core winding portion over the at least one winding surface;
providing a three-dimensional design file, the design file specifying a three-dimensional design for a monolithic heat sink element which includes a heat-receiving portion having at least one fluid channel therein that receives a fluid;
providing the three-dimensional design file to an additive manufacturing system;
forming the heat sink element, based on the three-dimensional design file, using the additive manufacturing system, wherein forming the heat sink element comprises:
converting three-dimensional information in the design file into a plurality of slices that each define a cross-sectional layer of the heat sink element; and
successively forming each layer of the heat sink element by fusing a metallic powder using laser energy; and
positioning the heat-receiving portion of the heat sink element between the winding surface of the core and at least a portion of the winding.

22. The power converter apparatus of claim 15 wherein a first portion of the at least one fluid channel extends in a first plane, and a second portion of the at least one fluid channel extends in a second plane, the second plane different from the first plane.

23. The power converter apparatus of claim 15 wherein the heat-receiving portion includes at least two fluid channels therein that receive a fluid, respective first portions of the at least two fluid channels extend in a first plane, and respective second portions of the at least two fluid channels extend in a second plane, the second plane different from the first plane.

24. The power converter apparatus of claim 23 wherein the first plane is an X-Y plane.

25. The power converter apparatus of claim 15 wherein the core winding portion includes four planar winding surfaces, and the heat-receiving portion of the heat sink element is positioned adjacent one of the four planar winding surfaces.

26. The power converter apparatus of claim 15 wherein the heat sink element is formed of at least one of copper, copper alloy, aluminum, or aluminum alloy.

27. The power converter apparatus of claim 15 wherein the heat-receiving portion of the heat sink element is positioned adjacent the winding surface and under the winding.

28. The power converter apparatus of claim 15 wherein the heat-receiving portion of the heat sink element includes a first interface surface that faces at least one of the at least one winding surface, and the at least one winding surface includes a second interface surface complementary to the first interface surface of the heat-receiving portion of the heat sink element.

29. The power converter apparatus of claim 15 wherein the heat-receiving portion is formed of a thermally conductive material having a plurality of fluid channels that each receives a fluid therethrough.

* * * * *